(12) United States Patent
Kawasumi

(10) Patent No.: US 11,410,721 B2
(45) Date of Patent: Aug. 9, 2022

(54) SEMICONDUCTOR MEMORY DEVICE

(71) Applicant: Kioxia Corporation, Tokyo (JP)

(72) Inventor: Atsushi Kawasumi, Fujisawa Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/199,650

(22) Filed: Mar. 12, 2021

(65) Prior Publication Data

US 2021/0295904 A1    Sep. 23, 2021

(30) Foreign Application Priority Data

Mar. 17, 2020  (JP) .............................. JP2020-046713

(51) Int. Cl.
| | | |
|---|---|---|
| *G11C 11/41* | (2006.01) | |
| *G11C 11/419* | (2006.01) | |
| *H01L 27/11* | (2006.01) | |
| *G11C 11/412* | (2006.01) | |

(52) U.S. Cl.
CPC .......... *G11C 11/419* (2013.01); *G11C 11/412* (2013.01); *H01L 27/1104* (2013.01)

(58) Field of Classification Search
None
See application file for complete search history.

(56) References Cited

U.S. PATENT DOCUMENTS

| | | | | |
|---|---|---|---|---|
| 2007/0268740 | A1* | 11/2007 | Aly | ....................... G11C 11/412 365/154 |
| 2011/0305073 | A1* | 12/2011 | Hirabayashi | .......... G11C 11/412 365/156 |
| 2015/0262058 | A1 | 9/2015 | Modha | |
| 2017/0154257 | A1 | 6/2017 | Cao | |
| 2019/0096475 | A1 | 3/2019 | Li | |

FOREIGN PATENT DOCUMENTS

JP        2019-505065 A       2/2019

* cited by examiner

*Primary Examiner* — Tan T. Nguyen
(74) *Attorney, Agent, or Firm* — Foley & Lardner LLP

(57) ABSTRACT

A semiconductor memory device of an embodiment includes: a first inverter including a first P-channel and first N-channel transistors; a second inverter including a second P-channel and second N-channel transistors and being cross-connected to the first inverter; a third P-channel transistor; a third N-channel transistor; a first wiring; a second wiring; a third wiring; a fourth wiring; a fifth wiring; a sixth wiring; and a controller that drives the first to sixth wirings. When writing second-level data that is at a higher potential level than first-level data into the drain of the second P-channel transistor and the drain of the second N-channel transistor, the controller puts one of the fifth wiring and the sixth wiring into a floating state.

20 Claims, 24 Drawing Sheets

SEMICONDUCTOR MEMORY DEVICE

CROSS REFERENCE TO RELATED APPLICATIONS

This application is based upon and claims the benefit of priority from the prior Japanese Patent Application No. 2020-046713, filed on Mar. 17, 2020, the entire contents of which are incorporated herein by reference.

BACKGROUND

Embodiments of the present invention relate to a semiconductor memory device.

In an artificial intelligence (AI) application, a plurality of matrices are normally used for an AI operation, and therefore, data is stored in a static random access memory (SRAM) array that includes cells arranged in a matrix. In an AI operation, matrix multiplication, such as a mathematical convolution operation that filter images for face recognition applications, is normally performed one or more times. In the convolution operation, a read operation needs to be performed a large number of times to read data from one column of the SRAM array and read data from each corresponding row separately. This leads to an increase in power consumption and an increase in processing time.

Therefore, in the convolution operation, an SRAM (a transpose SRAM) capable of reading data from both the row direction and the column direction is used so as to reduce power consumption and processing time. When high-potential-level data is to be written into a flip-flop circuit formed with two cross-connected inverters in a cell in this SRAM, an assist operation is performed to apply a high potential to the gate of an access transistor connected to the flip-flop circuit. As a result, current consumption increases during writing.

DETAILED DESCRIPTION

A semiconductor memory device according to an embodiment includes: a first inverter including a first P-channel transistor and a first N-channel transistor that are connected in series; a second inverter including a second P-channel transistor and a second N-channel transistor that are connected in series, the second inverter being cross-connected to the first inverter; a third P-channel transistor that has one of a source and a drain connected to a drain of the first P-channel transistor and a drain of the first N-channel transistor; a third N-channel transistor that has one of a source and a drain connected to a drain of the second P-channel transistor and a drain of the second N-channel transistor; a first wiring that is disposed in a first direction and is connected to the other one of the source and the drain of the third P-channel transistor; a second wiring that is disposed in the first direction and is connected to a gate of the third N-channel transistor; a third wiring that is disposed in a second direction intersecting the first direction and is connected to a gate of the third P-channel transistor; a fourth wiring that is disposed in the second direction and is connected to the other one of the source and the drain of the third N-channel transistor; a fifth wiring that is disposed in the first direction and is connected to a source of the first N-channel transistor and a source of the second N-channel transistor; a sixth wiring that is disposed in the second direction and is connected to a source of the first P-channel transistor and a source of the second P-channel transistor; and a controller that drives the first to sixth wirings, wherein, when writing second-level data that is at a higher potential level than first-level data into the drain of the second P-channel transistor and the drain of the second N-channel transistor, the controller puts one of the fifth wiring and the sixth wiring into a floating state.

The following is a description of embodiments of the present invention, with reference to the accompanying drawings.

First Embodiment

Figure 1:
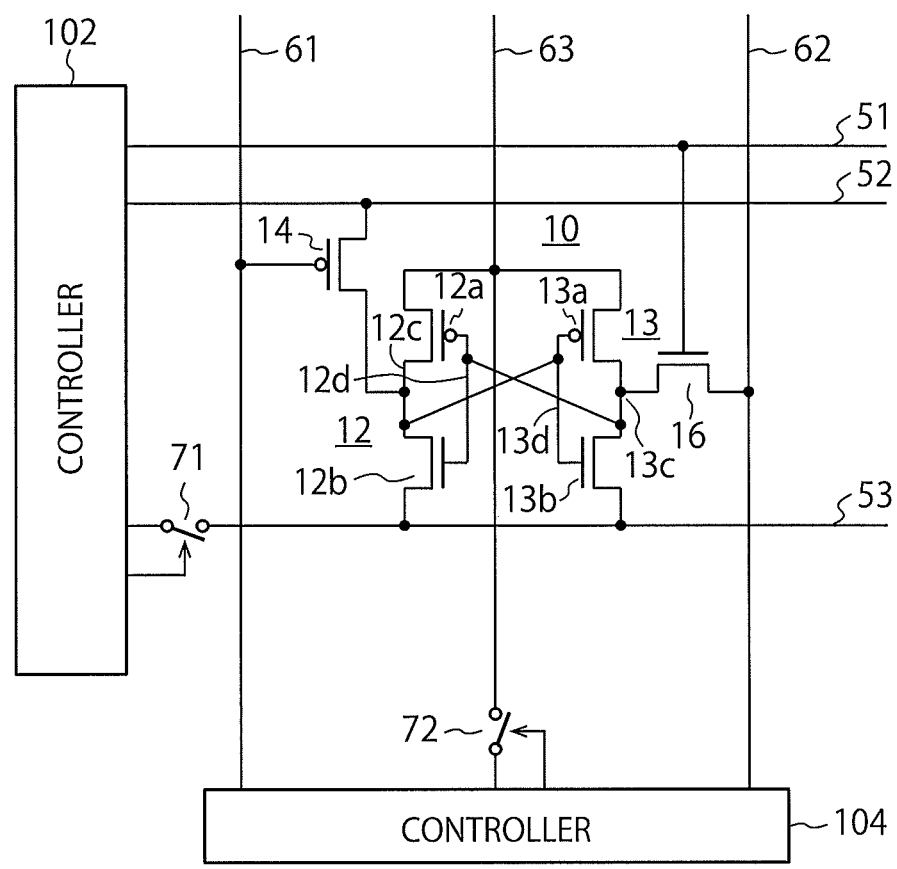
FIG. 1 is a circuit diagram showing the configuration of a semiconductor memory device according to a first embodiment.

As shown in FIG. 1, a semiconductor memory device according to a first embodiment includes at least one cell 10, wirings 51, 52, and 53 that are arranged in the vertical direction and extend in the horizontal direction in the drawing, wirings 61, 62, and 63 that are arranged in the horizontal direction and extend in the vertical direction in the drawing, switches 71 and 72, and controllers 102 and 104.

A cell 10 includes two cross-connected inverters 12 and 13, a P-channel access transistor (hereinafter also referred to simply as a transistor) 14, and an N-channel access transistor (hereinafter also referred to simply as a transistor) 16. The cross-connected inverters 12 and 13 constitute a flip-flop circuit.

The inverter 12 includes a P-channel transistor (hereinafter also referred to simply as a transistor) 12a and an N-channel transistor (hereinafter also referred to simply as a transistor) 12b that are connected in series, and the drain of the transistor 12a and the drain of the transistor 12b are connected by a wiring 12c. Also, the gate of the transistor 12a and the gate of the transistor 12b are connected by a wiring 12d. The inverter 13 includes a P-channel transistor (hereinafter also referred to simply as a transistor) 13a and an N-channel transistor (hereinafter also referred to simply as a transistor) 13b that are connected in series, and the drain of the transistor 13a and the drain of the transistor 13b are connected by a wiring 13c. Also, the gate of the transistor 13a and the gate of the transistor 13b are connected by a wiring 13d. Further, the gates of the transistor 12a and the transistor 12b, and the drains of the transistor 13a and the transistor 13b are connected, and the gates of the transistor 13a and the transistor 13b, and the drains of the transistor 12a and the transistor 12b are connected. The sources of the transistor 12a and the transistor 13a are both connected to the wiring 63, and the sources of the transistor 12b and the transistor 13b are both connected to the wiring 53.

In the transistor 14, one of the source and the drain is connected to the wiring 52, the other one is connected to the wiring 12c connecting the drain of the transistor 12a and the drain of the transistor 12b, and the gate is connected to the wiring 61. In the transistor 16, one of the source and the drain is connected to the wiring 13c connecting the drain of the transistor 13a and the drain of the transistor 13b, the other one is connected to the wiring 62, and the gate is connected to the wiring 51.

The wirings 51, 52, and 53 are connected to the controller 102, and are driven and controlled. The wirings 61, 62, and 63 are connected to the controller 104, and are driven and controlled. Although the controller 102 and the controller 104 are shown in FIG. 1, the controller 102 and the controller 104 may be combined into one controller. The switch 71 is disposed between the wiring 53 and the controller 102, and its switch-on/off operation is controlled by the controller 102. The switch 72 is disposed between the wiring 63 and the controller 104, and its switch-on/off operation is controlled by the controller 104. The switches 71 and 72 are normally in an on-state, a voltage $V_{SS}$ is applied to the wiring 53, and a voltage $V_{DD}$ is applied to the wiring 63. In a case where data is written into the cell 10 with the transistor 16, the switch 71 is put into an off-state, and the wiring 53 is put into a floating state. In a case where data is written into the cell 10 with the transistor 14, the switch 72 is put into an off-state, and the wiring 63 is put into a floating state.

(Write Operations)

Write operations of the semiconductor memory device of the first embodiment will be described below, with reference to FIGS. 2 to 5.

(H-Level Data Writing)

Figure 2:
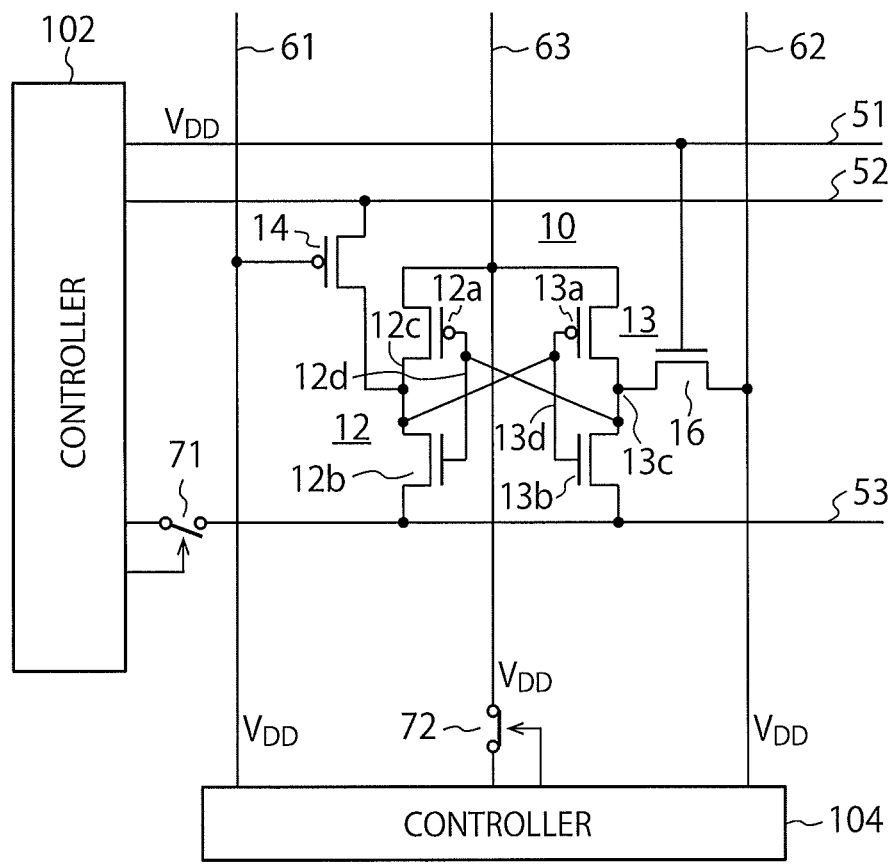
FIG. 2 is a diagram for explaining a first example of a write operation of the semiconductor memory device of the first embodiment.

First, in a case where the cell 10 holds L-level data, which is a case where the potential level of the wiring 13c of the inverter 13 is the L-level while the potential level of the wiring 12c of the inverter 12 is the H-level, H-level data may be written into the cell 10 with the transistor 16. This case is now described. As shown in FIG. 2, the controller 102 puts the switch 71 into an off-state, to put the wiring 53 into a floating state. The controller 104 puts the switch 72 into an on-state, to apply a potential $V_{DD}$ to the wiring 63 and the potential $V_{DD}$ to the wiring 62. At this stage, the potential $V_{DD}$ is also applied to the wiring 61 by the controller 104. As a result, the transistor 14 enters an off-state. In this writing process, the wiring 52 may not be used and may be put into a floating state, or a potential $V_{SS}$ may be applied thereto.

Figure 3:
FIG. 3 is a waveform diagram for explaining the first example of a write operation of the semiconductor memory device of the first embodiment.

The controller 102 raises the potential of the wiring 51 to $V_{DD}$ (see FIG. 3). As a result, the transistor 16 enters an on-state, and the potential of the wiring 13c of the inverter 13 rises. At this stage, the potential of the gate of the transistor 13b of the inverter 13 is at the H-level. Therefore, the transistor 13b is in an on-state, and the potential of the wiring 53 in a floating state rises from $V_{SS}$, as shown in FIG. 3. Accordingly, the voltage $V_{GS}$ between the gate and the source of the transistor 13b becomes lower, and the transistor 13b enters an off-state. Meanwhile, the potentials of the input terminals of the inverter 12, which are the potentials of the gates of the transistor 12a and the transistor 12b, are at the L-level before writing, the transistor 12a is in an on-state, and the transistor 12b is in an off-state. Accordingly, the wiring 12c of the inverter 12 is at the H-level. When writing is performed, as the potential of the wiring 13c of the inverter 13 rises, the transistor 12a enters an off-state, the transistor 12b enters an on-state, and the potential of the wiring 12c of the inverter 12 drops to the L-level. As a result, the transistor 13a of the inverter 13 enters an on-state, and the potential of the wiring 13c of the inverter 13 switches to $V_{DD}$. In this state, the potential of the wiring 53 remains elevated from $V_{SS}$. Therefore, at the end of the writing, the controller 102 puts the switch 71 into an on-state, and sets the potential of the wiring 53 to $V_{SS}$.

Figure 4:
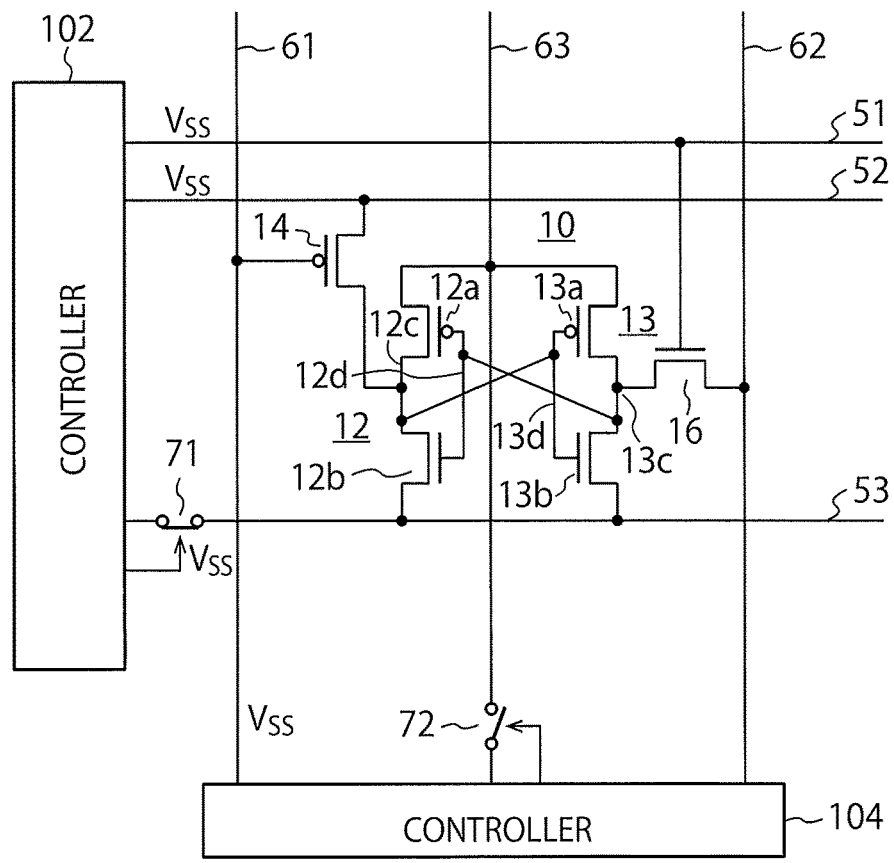
FIG. 4 is a diagram for explaining a second example of a write operation of the semiconductor memory device of the first embodiment.

Next, in a case where the cell 10 holds L-level data, which is a case where the potential level of the wiring 13c of the inverter 13 is the L-level while the potential level of the wiring 12c of the inverter 12 is the H-level, H-level data may be written into the cell 10 with the transistor 14. This case is now described. As shown in FIG. 4, the controller 102 puts the switch 71 into an on-state, to apply the potential $V_{SS}$ to the wiring 53, and the controller 104 puts the switch 72 into an off-state, to put the wiring 63 into a floating state. At this stage, the potential $V_{SS}$ is applied to the wiring 51 by the controller 102. As a result, the transistor 16 enters an off-state. In this writing process, the wiring 62 may not be used and may be put into a floating state, or the potential $V_{DD}$ may be applied thereto.

Figure 5:
FIG. 5 is a waveform diagram for explaining the second example of a write operation of the semiconductor memory device of the first embodiment.

The controller 102 sets the potential of the wiring 52 to $V_{SS}$, and the controller 104 lowers the potential of the wiring 61 from $V_{DD}$ to $V_{SS}$ (see FIG. 5). As a result, the transistor 14 enters an on-state, and the potential of the wiring 12c of the inverter 12 drops from $V_{DD}$. At this stage, the potential of the wiring 13c of the inverter 13 is at the L-level. Accordingly, the transistor 12a is in an on-state, and the transistor 12b is in an off-state. Therefore, the potential of the wiring 63 in a floating state drops from $V_{DD}$, as shown in FIG. 5. Further, since the potential of the wiring 12c of the inverter 12 drops, the transistor 13a of the inverter 13 enters an on-state, the transistor 13b enters an off-state, and the potential of the wiring 13c of the inverter 13 rises to a value close to the H-level. As a result, the transistor 12b of the inverter 12 enters an on-state, and the potential of the wiring 12c of the inverter 12 switches to $V_{SS}$. At the end of the writing, the controller 104 puts the switch 72 into an on-state, to apply the voltage $V_{DD}$ to the wiring 63. As a result, the potential of the wiring 13c of the inverter 13 switches to $V_{DD}$, and thus, the writing of the H-level data is completed.

(L-Level Data Writing)

Next, a case where L-level data is written into the cell 10 holding H-level data is described with reference to FIGS. 6 and 7. In this case, the potential of the wiring 13c of the inverter 13 is at the H-level ($V_{DD}$), and the potential of the wiring 12c of the inverter 12 is at the L-level ($V_{SS}$).

Figure 6:
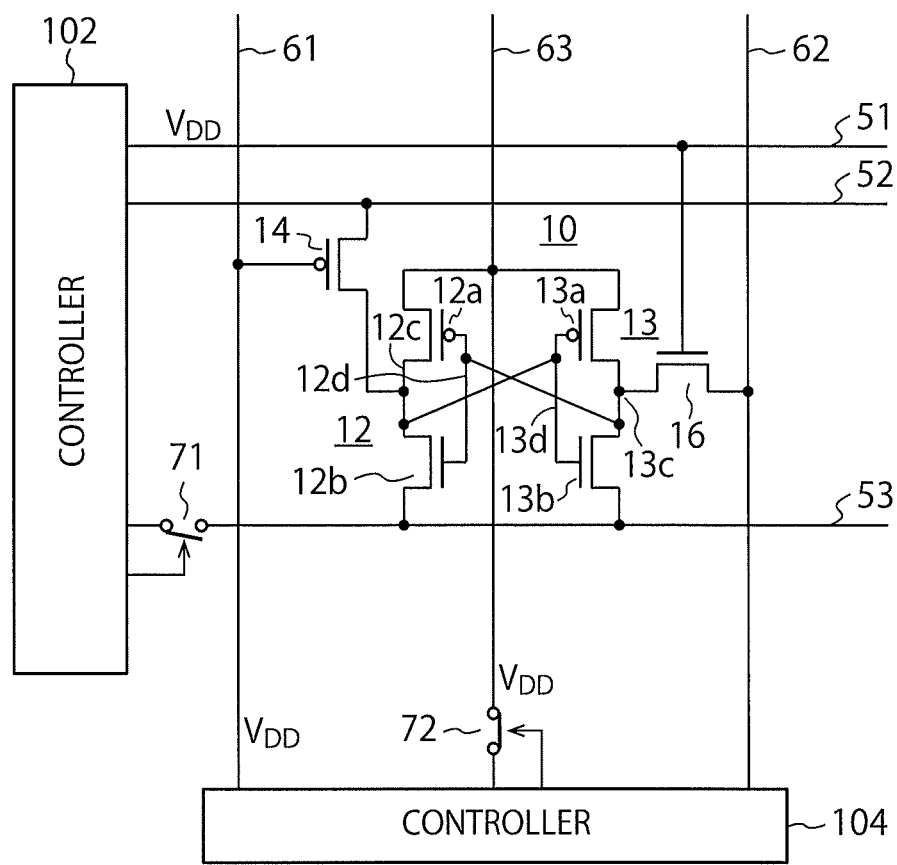
FIG. 6 is a diagram for explaining a third example of a write operation of the semiconductor memory device of the first embodiment.

First, in a case where L-level data is to be written into the wiring 13c of the inverter 13 with the transistor 16, the controller 102 puts the switch 71 into an off-state, to put the wiring 53 into a floating state, and the controller 104 puts the switch 72 into an on-state, to apply the potential $V_{DD}$ to the wiring 63 (FIG. 6). The controller 104 then applies the potential $V_{DD}$ to the wiring 61, to put the transistor 14 into an off-state. The controller 104 also applies the potential $V_{SS}$ to the wiring 62. In this state, the controller 102 raises the potential of the wiring 51 to $V_{DD}$. As a result, the transistor 16 enters an on-state, and the potential of the wiring 13c of the inverter 13 changes from the H-level to the L-level. Thus, the transistor 12a of the inverter 12 enters an on-state, the potential of the wiring 12c of the inverter 12 switches to $V_{DD}$, and the L-level data can be written into the cell 10. In this writing, the controller 102 may put the wiring 52 into a floating state, or apply the potential $V_{SS}$ thereto, as in the case described above with reference to FIG. 2.

Figure 7:
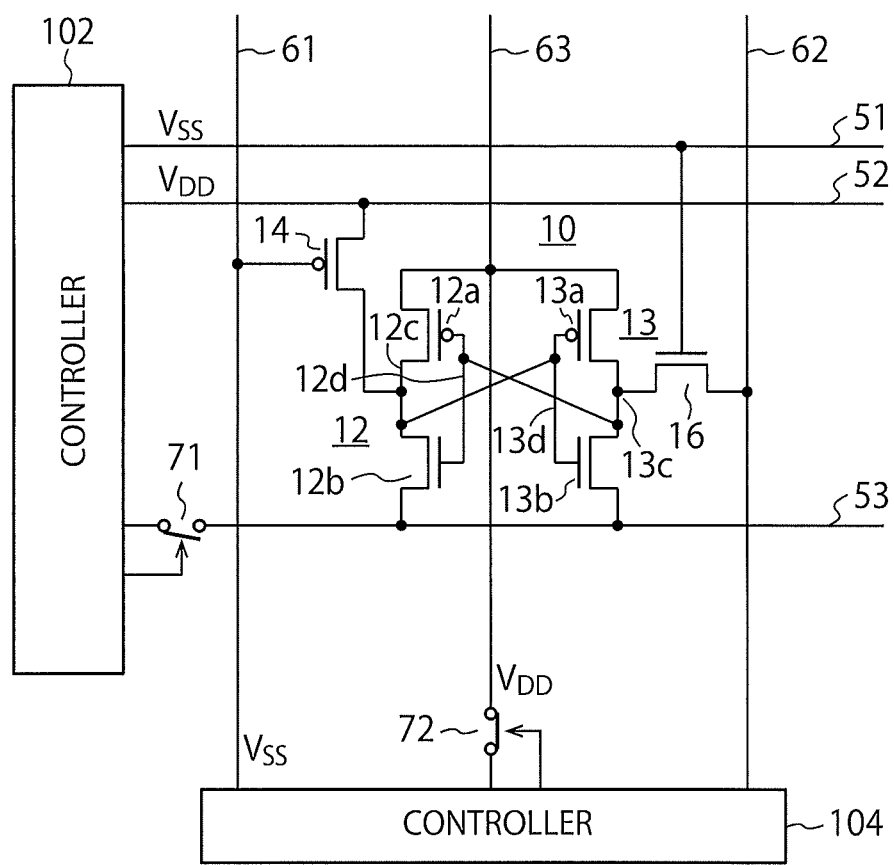
FIG. 7 is a diagram for explaining a fourth example of a write operation of the semiconductor memory device of the first embodiment.

Next, in a case where L-level data is to be written into the wiring 13c of the inverter 13 with the transistor 14, the controller 102 puts the switch 71 into an off-state, to put the wiring 53 into a floating state, and the controller 104 puts the switch 72 into an on-state, to apply the potential $V_{DD}$ to the wiring 63 (FIG. 7). The controller 102 then applies the potential $V_{SS}$ to the wiring 51, to put the transistor 16 into an off-state. The controller 102 also applies the potential $V_{DD}$ to the wiring 52. In this state, the controller 104 lowers the potential of the wiring 61 to $V_{SS}$. As a result, the transistor 14 enters an on-state, and the potential of the wiring 12c of the inverter 12 changes from the L-level to the H-level. Thus, the transistor 13b of the inverter 13 enters an on-state, the potential of the wiring 13c of the inverter 13 drops, and the L-level data can be written into the cell 10. In this writing, the controller 104 may put the wiring 62 into a floating state, or apply the potential $V_{DD}$ thereto, as in the case described above with reference to FIG. 4.

(Read Operations)

Next, cases where data is read from the cell 10 will be described with reference to FIGS. 8 to 11.

Figure 8:
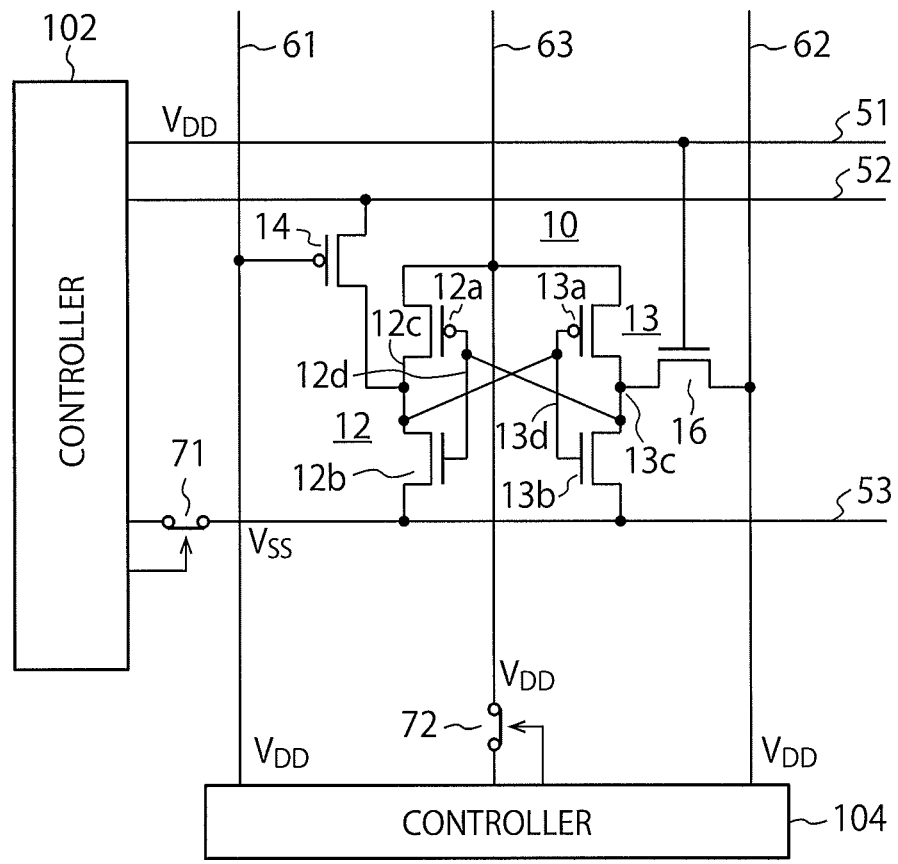
FIG. 8 is a diagram for explaining a first example of a read operation of the semiconductor memory device of the first embodiment.
Figure 9:
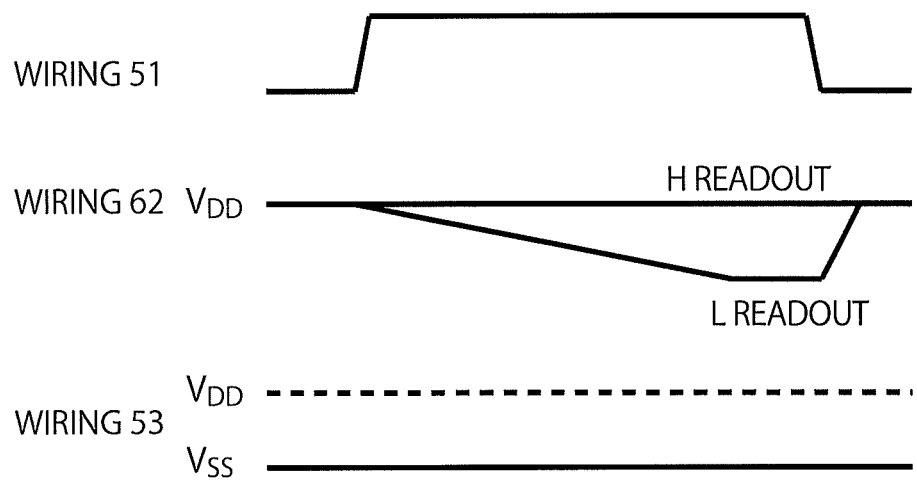
FIG. 9 is a waveform diagram for explaining the first example of a read operation of the semiconductor memory device of the first embodiment.

First, in a case where data is to be read from the cell 10 via the transistor 16, the controller 102 puts the switch 71 into an on-state and fixes the potential of the wiring 53 to $V_{SS}$, and the controller 104 puts the switch 72 into an on-state and applies the voltage $V_{DD}$ to the wiring 63. The controller 104 also applies the potential $V_{DD}$ to the wiring 61 to put the transistor 14 into an off-state, and precharges the potential of the wiring 62 with $V_{DD}$ (FIGS. 8 and 9). In this state, the controller 102 raises the potential of the wiring 51 to $V_{DD}$. The transistor 16 then enters an on-state, and the potential of the wiring 62 precharged with $V_{DD}$ becomes a signal corresponding to the potential of the wiring 13c of the inverter 13, as shown in FIG. 9. That is, in a case where the data held in the wiring 13c is of the H-level, the potential of the wiring 62 does not change and remains $V_{DD}$. In a case where the data held in the wiring 13c is of the L-level, the potential of the wiring 62 drops. As the potential of the wiring 62 is amplified with a sense amplifier (not shown), the data stored in the cell 10 is read out.

Figure 10:
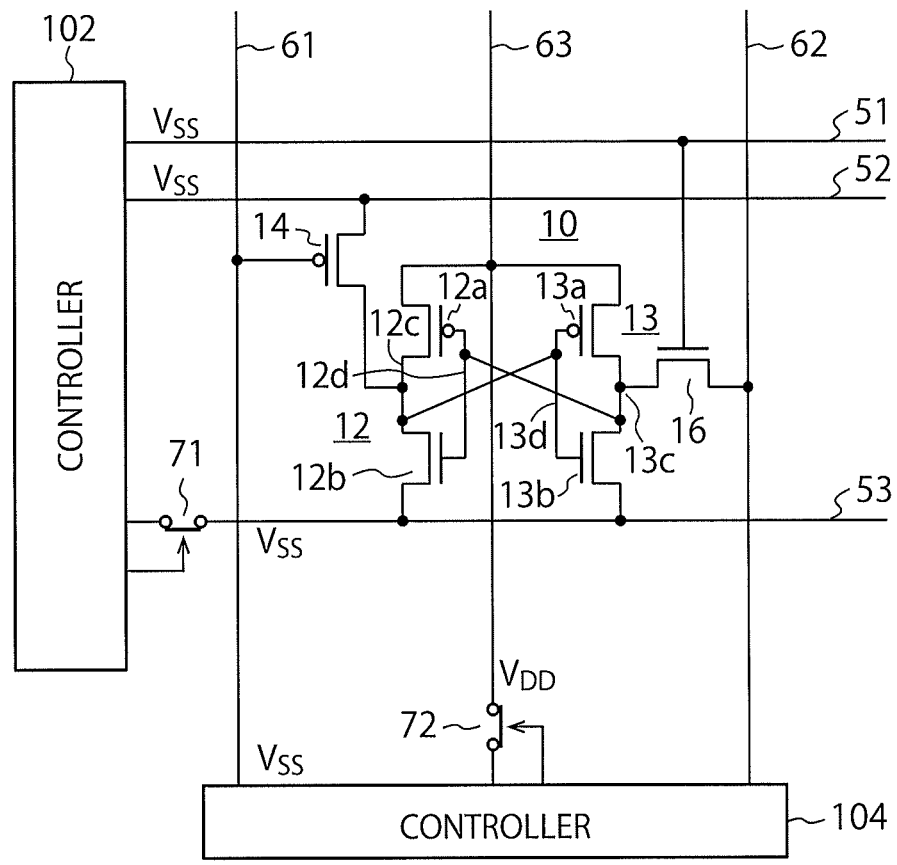
FIG. 10 is a diagram for explaining a second example of a read operation of the semiconductor memory device of the first embodiment.
Figure 11:
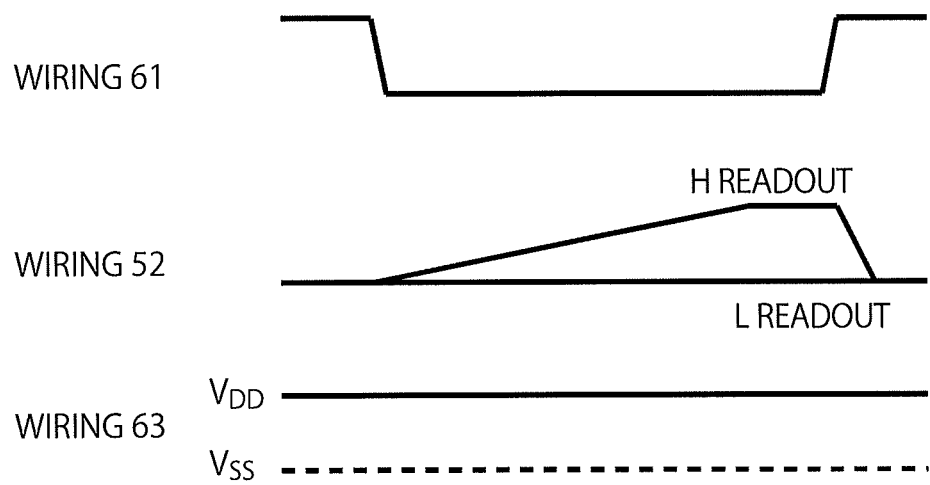
FIG. 11 is a waveform diagram for explaining the second example of a read operation of the semiconductor memory device of the first embodiment.

Next, in a case where data is to be read from the cell 10 via the transistor 14, the controller 102 puts the switch 71 into an on-state and fixes the voltage of the wiring 53 to $V_{SS}$, and the controller 104 puts the switch 72 into an on-state and applies the potential $V_{DD}$ to the wiring 63. The controller 102 also applies the potential $V_{SS}$ to the wiring 51 to put the transistor 16 into an off-state, and discharges the potential of the wiring 52 to $V_{SS}$ (FIGS. 10 and 11). In this state, the potential of the wiring 61 is lowered to $V_{SS}$. The transistor 14 then enters an on-state, and the potential of the wiring 52 precharged with $V_{SS}$ becomes a signal corresponding to the potential of the wiring 12c of the inverter 12, as shown in FIG. 11. That is, in a case where the data held in the wiring 12c is of the H-level, the potential of the wiring 52 rises from $V_{SS}$. In a case where the data held in the wiring 12c is of the L-level, the potential of the wiring 52 does not change but remains $V_{SS}$. As the potential of the wiring 52 is amplified with a sense amplifier (not shown), the data stored in the cell 10 is read out. As can be seen from the above explanation, the data read through the transistor 16 and the data read through the transistor 14 are of the H-level and the L-level, which are the opposite of each other.

As described above, the first embodiment can provide a semiconductor memory device including an SRAM (a transpose SRAM) that is capable of reducing the increase in power consumption, and performing data writing and reading in both row and column directions.

In the first embodiment, the switch 71 is disposed between the controller 102 and the wiring 53, and the switch 72 is disposed between the controller 104 and the wiring 63, to put the potential of the wiring 53 or the potential of the wiring 63 into a floating state at the time of writing, and thus assist the writing. However, the potential of the wiring 53 or the potential of the wiring 63 may be put into a floating state even when writing that does not require any assist is performed.

Figure 12:
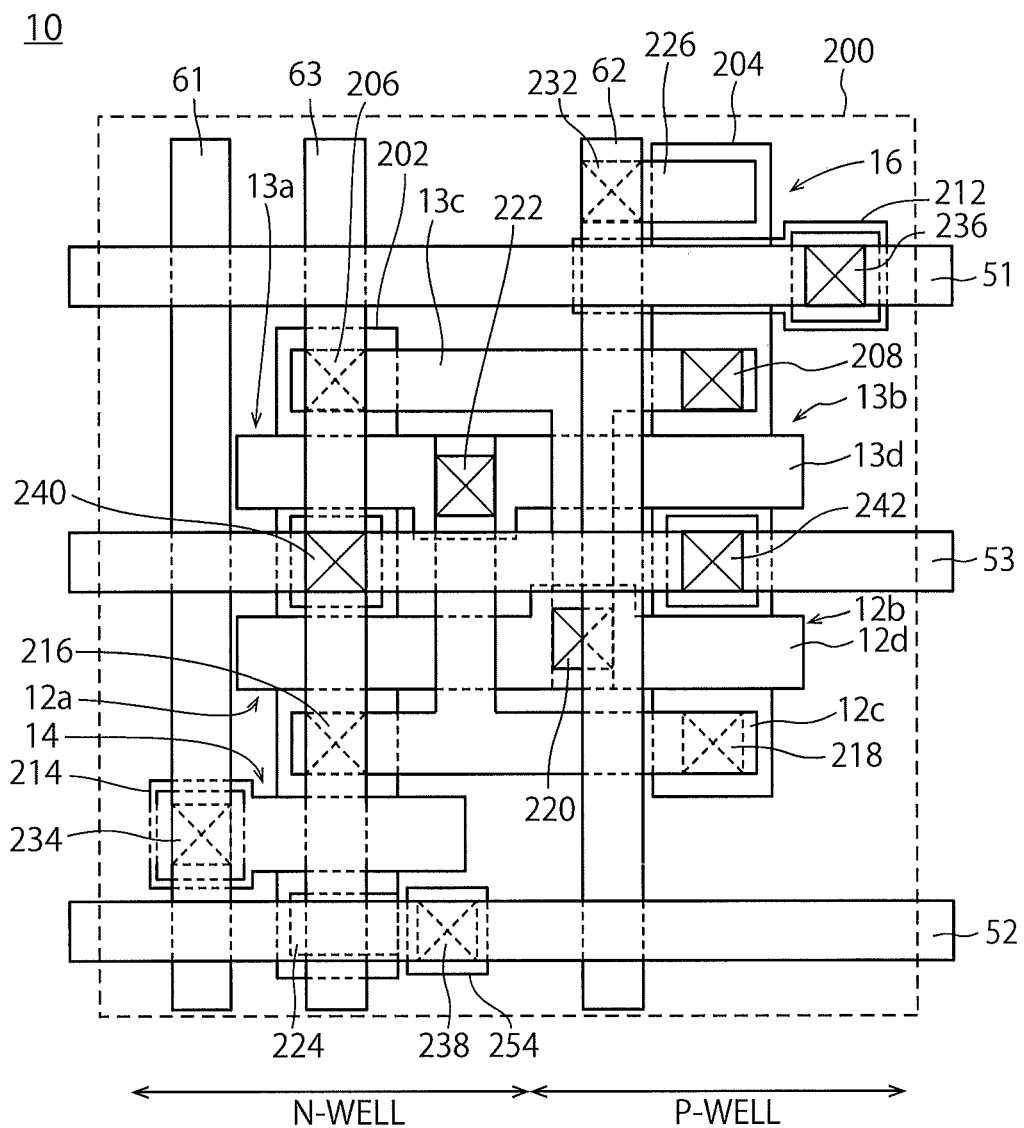
FIG. 12 is a diagram showing an example layout in the semiconductor memory device of the first embodiment.

FIG. 12 shows an example layout in a cell 10 of the semiconductor memory device of the first embodiment. An N-well and a P-well are formed in a semiconductor layer 200. The polysilicon-containing gate 212 of the transistor 16 is disposed in the P-well so as to extend horizontally in the drawing, and the polysilicon-containing gate 214 of the transistor 14 is disposed in the N-well so as to extend horizontal in the drawing. Further, the polysilicon-containing wiring 12*d* that serves as the gate of the transistor 12*a* and the gate of the transistor 12*b* is disposed in the N-well and the P-well so as to extend horizontally in the drawing. The polysilicon-containing wiring 13*d* that serves as the gate of the transistor 13*a* and the gate of the transistor 13*b* is disposed in the N-well and the P-well so as to extend horizontally in the drawing.

In the N-well, the transistor 13*a*, the transistor 12*a*, and the transistor 14 are arranged in this order from the top to the bottom in FIG. 12. In the P-well, the transistor 16, the transistor 13*b*, and the transistor 12*b* are arranged in this order from the top to the bottom in FIG. 12.

An N-type impurity region 204 is formed in the P-well on both sides of the gate 212 of the transistor 16, the N-type impurity region 204 is also formed in the P-well on both sides of the gate 13*d* of the transistor 13*b*, and the N-type impurity region 204 is further formed in the P-well on both sides of the gate 12*d* of the transistor 12*b*. The drain of the transistor 16 and the drain of the transistor 13*b* share the N-type impurity region 204 between them, and the source of the transistor 13*b* and the source of the transistor 12*b* share the N-type impurity region 204 located between them.

A P-type impurity region 202 is formed in the N-well on both sides of the gate 13*d* of the transistor 13*a*, the P-type impurity region 202 is also formed in the N-well on both sides of the gate 12*d* of the transistor 12*a*, and the P-type impurity region 202 is further formed in the N-well on both sides of the gate 214 of the transistor 14. The source of the transistor 13*a* and the source of the transistor 12*a* share the P-type impurity region 202 between them, and the drain of the transistor 12*a* and the drain of the transistor 14 share the P-type impurity region 202 located between them.

The wiring 13*c* connecting a contact 206 connected to the drain of the transistor 13*a* and a contact 208 connected to the drain of the transistor 13*b* is disposed above the wiring 13*d* and is connected to the wiring 12*d* via a contact 220. The wiring 12*c* connecting a contact 216 connected to the drain of the transistor 12*a* and a contact 218 connected to the drain of the transistor 12*b* is disposed above the wiring 12*d* and is connected to the wiring 13*d* via a contact 222.

Further, a lead-out wiring 224 connected to the source of the transistor 14 is disposed so as to extend in a direction toward the P-well. A lead-out wiring 226 connected to the source of the transistor 16 is disposed so as to extend in a direction toward the N-well. The wirings 13*c* and 12*c* and the lead-out wirings 224 and 226 are disposed in a first metal wiring layer.

The wiring 61 is disposed on the N-well vertically in FIG. 12, and is connected to the gate 214 of the transistor 14 via a contact 234. The wiring 62 is disposed on the P-well vertically in FIG. 12, and is connected to the lead-out wiring 226 of the source of the transistor 16 via a contact 232. The wiring 63 is disposed on the N-well vertically in FIG. 12, and is connected to the sources of the transistor 13*a* and the transistor 12*a* via a contact 240. The wirings 61, 62, and 63 are disposed in a second metal wiring layer disposed above the first metal wiring layer. In this layout diagram, the wiring 63 is disposed between the wiring 61 and the wiring 62.

The wiring 51 is disposed horizontally in FIG. 12. The wiring 51 is connected to the gate 212 of the transistor 16 via a contact 236. The wiring 52 is disposed horizontally in FIG. 12. This wiring 52 is connected to the lead-out wiring 224 of the transistor 14 via a pad portion 254 and a contact 238. The pad portion 254 is disposed in the second metal wiring layer, and is connected to the lead-out wiring 224 via a contact (not shown) located directly below the contact 238. The pad portion 254 is connected to the wiring 52 via the contact 238. The wiring 53 is disposed horizontally in FIG. 12. The wiring 53 is connected to the sources of the transistors 12*b* and 13*b* via a contact 242.

The cell 10 having such a layout has the same connection structure as the cell 10 shown in FIG. 1. The layout shown in FIG. 12 is an example, and a layout having the same connection structure as the cell 10 shown in FIG. 1 can also be adopted.

Second Embodiment

Figure 13:
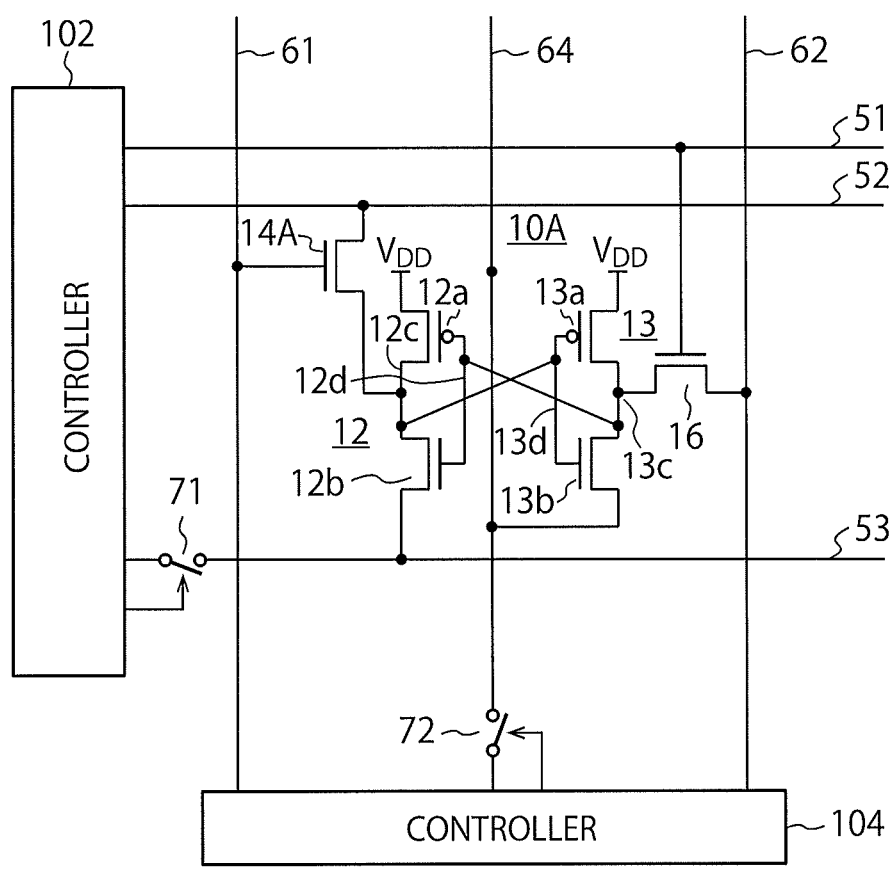
FIG. 13 is a circuit diagram showing the configuration of a semiconductor memory device according to a second embodiment.

As shown in FIG. 13, a semiconductor memory device according to a second embodiment includes at least one cell 10A, wirings 51, 52, and 53 that are arranged in the vertical direction and extend in the horizontal direction in the drawing, wirings 61, 62, and 64 that are arranged in the horizontal direction and extend in the vertical direction in the drawing, switches 71 and 72, and controllers 102 and 104.

A cell 10A includes two cross-connected inverters 12 and 13, an N-channel access transistor (hereinafter also referred to simply as a transistor) 14A, and an N-channel access transistor (hereinafter also referred to simply as a transistor) 16. That is, the cell 10A has the same configuration as the cell 10 of the first embodiment shown in FIG. 1, except that the P-channel transistor 14 is replaced with the N-channel transistor 14A. However, the transistor 13*b* of the inverter 13 has its drain connected to the wiring 13*c* as in the case illustrated in FIG. 1, but has its source connected to the wiring 64. The switch 72 is disposed between the wiring 64 and the controller 104. Further, the sources of the transistor 12*a* of the inverter 12 and the transistor 13*a* of the inverter 13 are connected to a power supply $V_{DD}$.

In the transistor 14A, one of the source and the drain is connected to the wiring 52, the other one is connected to the wiring 12*c* connecting the drain of the transistor 12*a* and the drain of the transistor 12*b*, and the gate is connected to the wiring 61.

(Write Operations)

Write operations of the semiconductor memory device of the second embodiment having such a configuration will be described below, with reference to FIGS. 14 to 17.

(H-Level Data Writing)

Figure 14:
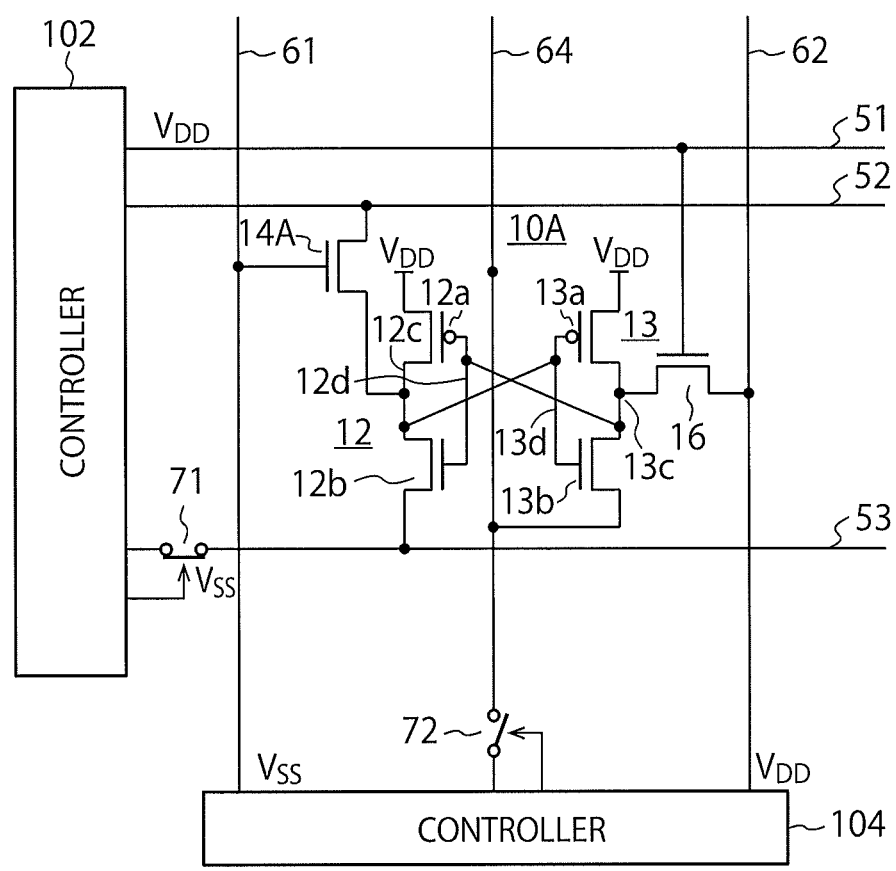
FIG. 14 is a diagram for explaining a first example of a write operation of the semiconductor memory device of the second embodiment.

First, a case where H-level data is to be written into the cell 10A with the transistor 16 is described. As shown in FIG. 14, the controller 102 puts the switch 71 into an on-state, and applies a potential $V_{SS}$ to the wiring 53. The controller 104 puts the switch 72 into an off-state, to put the wiring 64 into a floating state, and the controller 104 applies the potential $V_{SS}$ to the wiring 61, to put the transistor 14A into an off-state. The controller 104 applies the potential $V_{DD}$ to the wiring 62. The wiring 52 may be put into a floating state by the controller 102, or the potential $V_{DD}$ may be applied thereto.

In this state, the controller 102 raises the potential of the wiring 51 to $V_{DD}$. As a result, the transistor 16 enters an on-state, and the potential of the wiring 13c of the inverter 13 rises to the H-level ($V_{DD}$-level), as in the case described above with reference to FIG. 2. After that, the controller 104 puts the switch 72 into an on-state and applies the potential $V_{SS}$ to the wiring 64. As a result, the potential of the wiring 13c switches to $V_{DD}$, and the writing of the H-level data into the cell 10A is completed.

Figure 15:
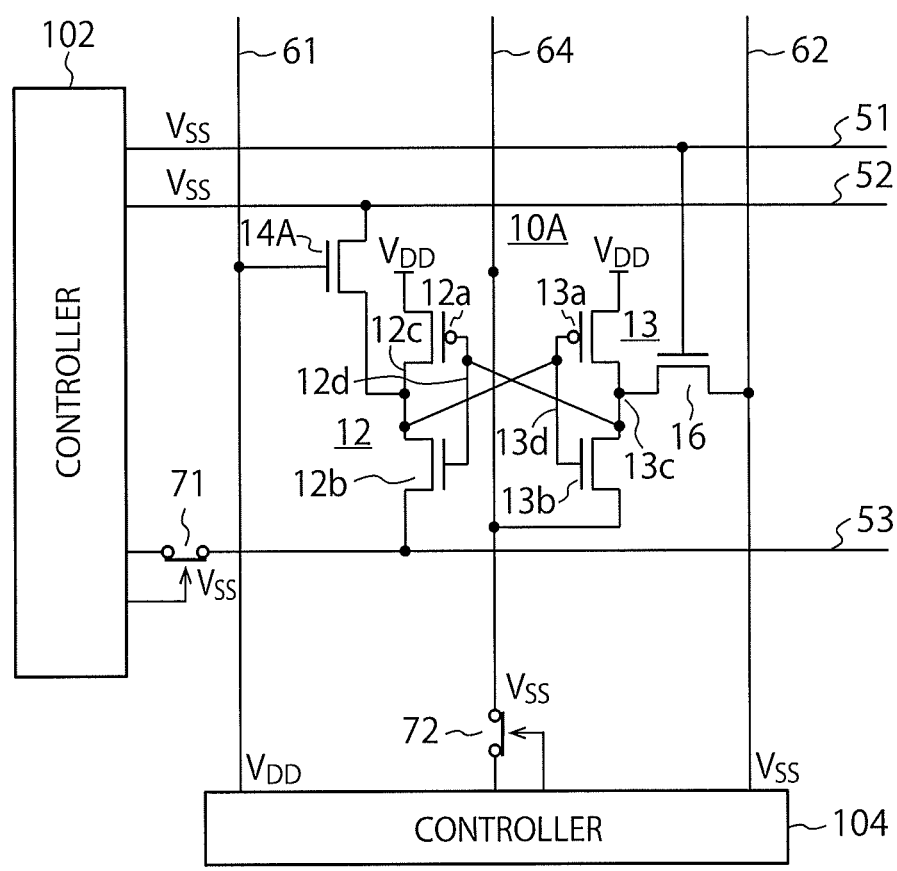
FIG. 15 is a diagram for explaining a second example of a write operation of the semiconductor memory device of the second embodiment.

Next, a case where H-level data is to be written into the cell 10A with the transistor 14A is described. In this case, L-level data is written into the wiring 12c in the cell 10A, which is the same as the case where L-level data is written with the transistor 16 in FIG. 6. That is, the controller 102 puts the switch 71 into an on-state, to apply the potential $V_{SS}$ to the wiring 53, as shown in FIG. 15. The controller 102 applies the potential $V_{55}$ to the wiring 51 to put the transistor 16 into an off-state, and applies the potential $V_{55}$ to the wiring 52. Also, the controller 104 puts the switch 72 into an on-state, to apply the potential $V_{55}$ to the wiring 64 and the potential $V_{DD}$ to the wiring 62. The wiring 62 may be put into a floating state by the controller 104.

In this state, the controller 104 raises the potential of the wiring 61 to $V_{DD}$. As a result, the transistor 14A enters an on-state, and the potential of the wiring 12c of the inverter 12 drops to the L-level ($V_{SS}$-level) as in the case described in FIG. 6. Thus, the writing of the H-level data into the cell 10A is completed.

(L-Level Data Writing)

Figure 16:
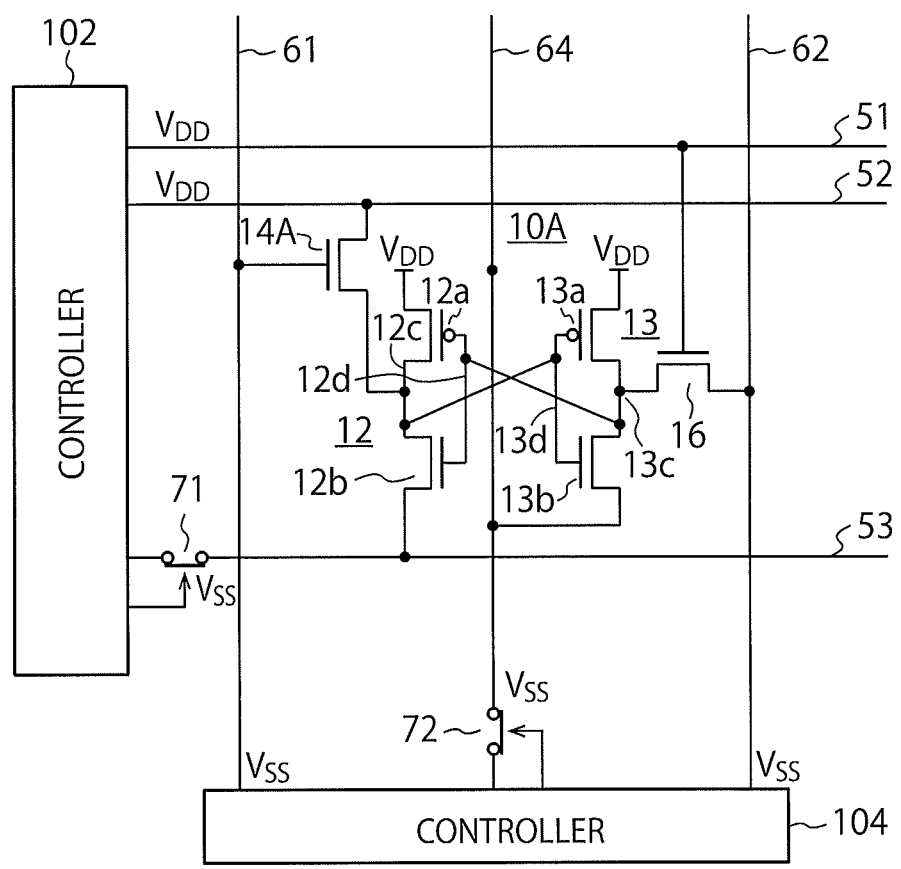
FIG. 16 is a diagram for explaining a third example of a write operation of the semiconductor memory device of the second embodiment.

Next, a case where L-level data is to be written into the cell 10A with the transistor 16 is described with reference to FIG. 16. In this case, L-level data is written into the wiring 13c in the cell 10A, which is the same as the case where L-level data is written with the transistor 16 in FIG. 6. That is, the controller 102 puts the switch 71 into an on-state, to apply the potential $V_{SS}$ to the wiring 53 and the potential $V_{DD}$ to the wiring 52, as shown in FIG. 16. The potential of the wiring 52 may be put into a floating state by the controller 102. The controller 104 puts the switch 72 into an on-state, to apply the potential $V_{SS}$ to the wiring 64. The controller 104 further applies the potential $V_{SS}$ to the wiring 61 to put the transistor 14A into an off-state, and applies the potential $V_{SS}$ to the wiring 62.

In this state, the potential of the wiring 51 is raised to $V_{DD}$. As a result, the transistor 16 enters an on-state, and the potential of the wiring 13c of the inverter 13 drops to the L-level ($V_{SS}$-level) as in the case described in FIG. 6. Thus, the writing of the L-level data into the cell 10A is completed.

Figure 17:
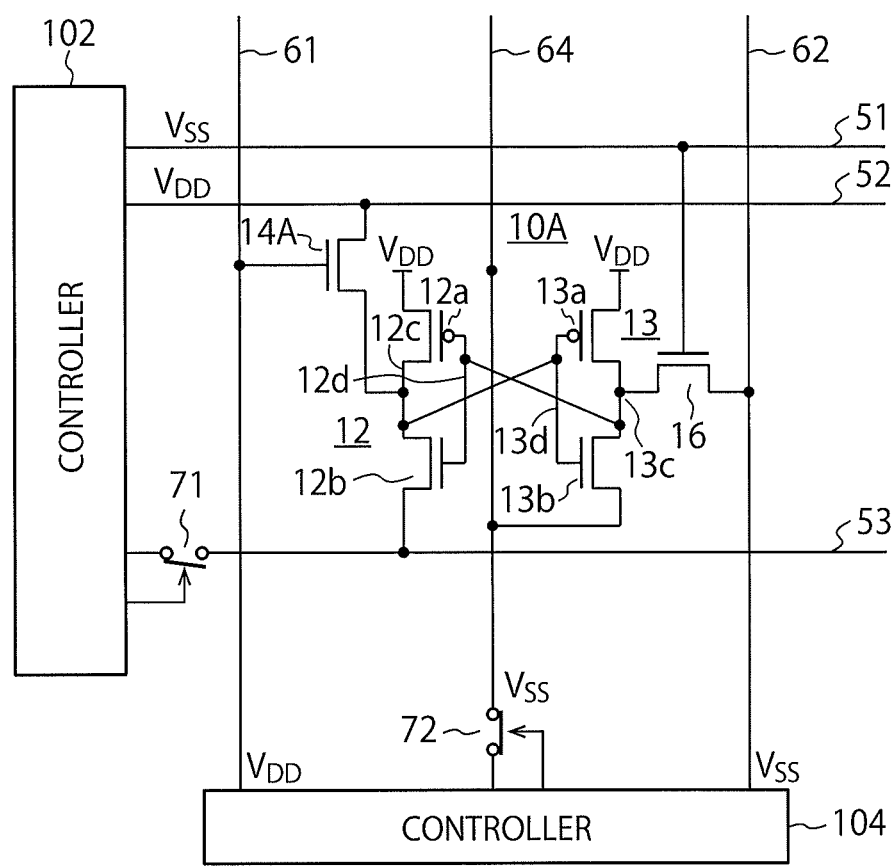
FIG. 17 is a diagram for explaining a fourth example of a write operation of the semiconductor memory device of the second embodiment.

Next, a case where L-level data is to be written into the cell 10A with the transistor 14A is described with reference to FIG. 17. In this case, H-level data is written into the wiring 12c in the cell 10A, which is the same as the case where H-level data is written with the transistor 16 in FIG. 14. That is, as shown in FIG. 17, the controller 102 puts the switch 71 into an off-state to put the wiring 53 into a floating state, and applies the potential $V_{SS}$ to the wiring 51 to put the transistor 16 into an off-state. The controller 102 also applies the potential $V_{DD}$ to the wiring 52. The controller 104 puts the switch 72 into an on-state, to apply the potential $V_{SS}$ to the wiring 64 and the potential $V_{SS}$ to the wiring 62. The potential of the wiring 62 may be put into a floating state by the controller 104.

In this state, the potential of the wiring 61 is raised to $V_{DD}$. As a result, the transistor 14A enters an on-state, and the potential of the wiring 12c of the inverter 12 rises almost to the H-level ($V_{DD}$-level), as in the case described above with reference to FIG. 2. After that, the controller 102 puts the switch 71 into an on-state, to apply the potential $V_{SS}$ to the wiring 53. Thus, the writing of the L-level data into the cell 10A is completed.

(Read Operations)

Figure 18:
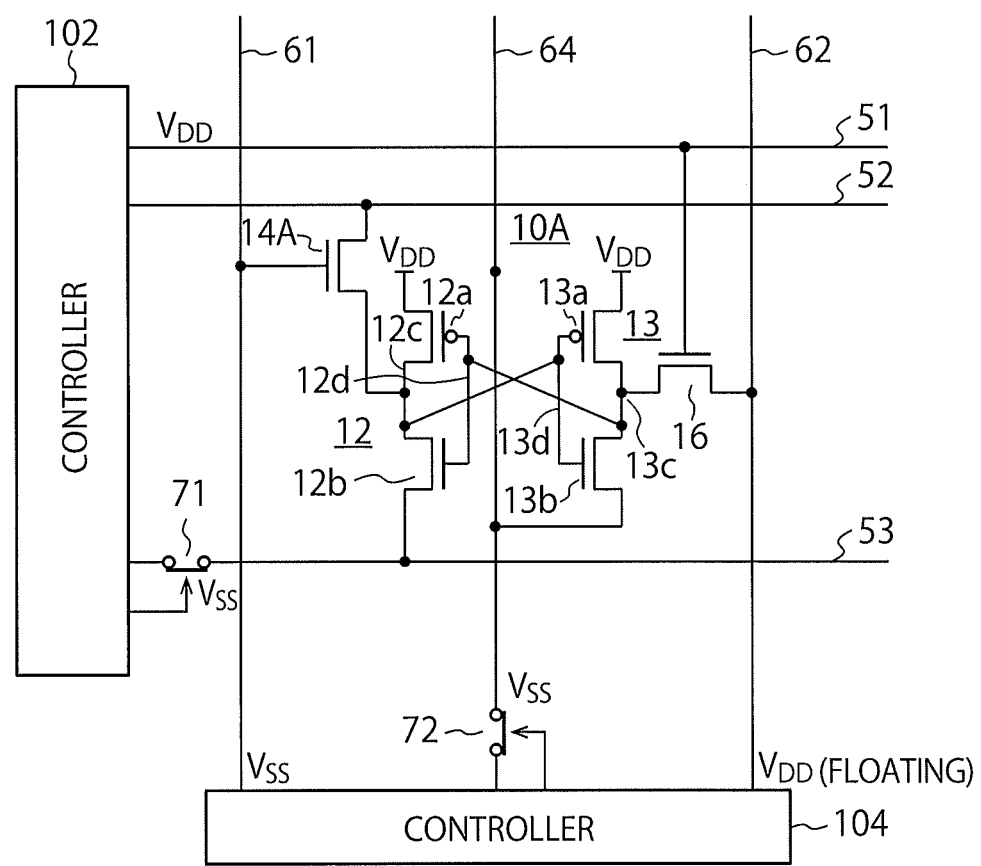
FIG. 18 is a diagram for explaining a first example of a read operation of the semiconductor memory device of the second embodiment.
Figure 19:
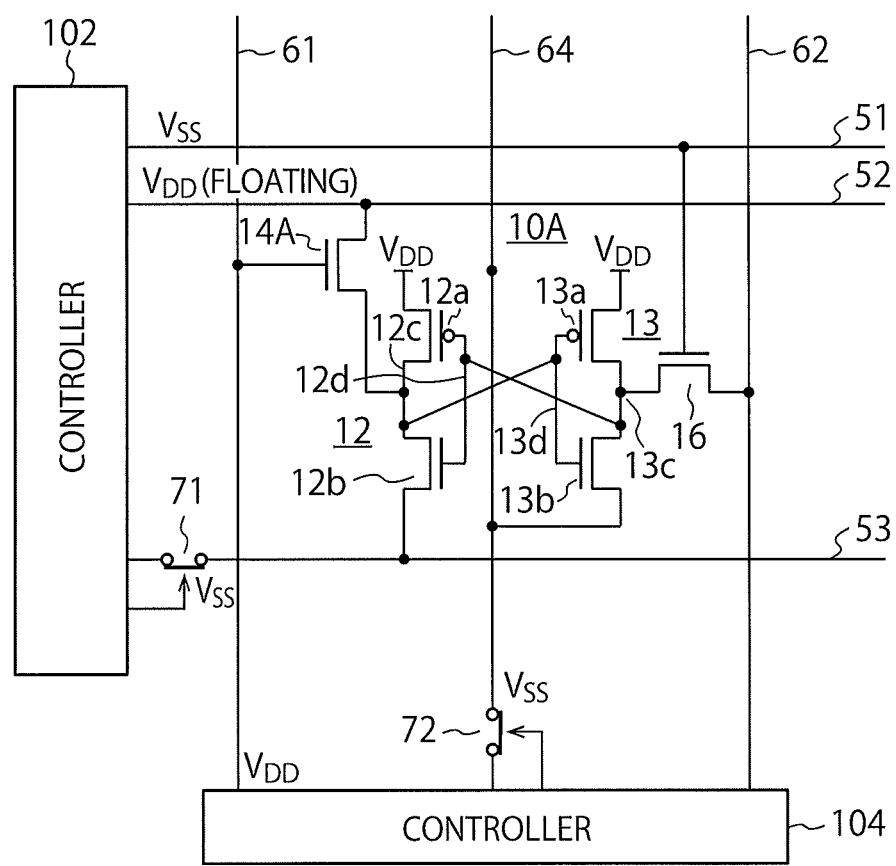
FIG. 19 is a diagram for explaining a second example of a read operation of the semiconductor memory device of the second embodiment.

Next, cases where data is read from the cell 10A will be described with reference to FIGS. 18 and 19.

First, in a case where data is to be read from the cell 10A via the transistor 16, the controller 102 puts the switch 71 into an on-state and fixes the potential of the wiring 53 to $V_{SS}$, and the controller 104 puts the switch 72 into an on-state and fixes the voltage of the wiring 64 to $V_{SS}$. The controller 104 also applies the potential $V_{SS}$ to the wiring 61 to put the transistor 14A into an off-state, and precharges the potential of the wiring 62 with $V_{DD}$ (FIG. 18). In this state, the controller 102 raises the potential of the wiring 51 to $V_{DD}$. The transistor 16 then enters an on-state, and the potential of the wiring 62 precharged with $V_{DD}$ becomes a signal corresponding to the potential of the wiring 13c of the inverter 13. That is, in a case where the data held in the wiring 13c is of the H-level, the potential of the wiring 62 does not change and remains $V_{DD}$. In a case where the data held in the wiring 13c is of the L-level, the potential of the wiring 62 drops. As the potential of the wiring 62 is amplified with a sense amplifier (not shown), the data stored in the cell 10A is read out. In this read operation, the potential $V_{DD}$ may be applied to the wiring 52 by the controller 102, or the wiring 52 may be put into a floating state.

Next, in a case where data is to be read from the cell 10A via the transistor 14A, the controller 102 puts the switch 71 into an on-state and fixes the voltage of the wiring 53 to $V_{SS}$, and the controller 104 puts the switch 72 into an on-state and applies the potential $V_{SS}$ to the wiring 64. The controller 102 also applies the potential $V_{SS}$ to the wiring 51 to put the transistor 16 into an off-state, and precharges the potential of the wiring 52 with $V_{DD}$ (FIG. 19). In this state, the potential of the wiring 61 is raised to $V_{DD}$. The transistor 14A then enters an on-state, and the potential of the wiring 52 precharged with $V_{DD}$ becomes a signal corresponding to the potential of the wiring 12c of the inverter 12. That is, in a case where the data held in the wiring 12c is of the H-level, the potential of the wiring 52 does not change and remains $V_{DD}$. In a case where the data held in the wiring 12c is of the L-level, the potential of the wiring 52 drops. As the potential of the wiring 52 is amplified with a sense amplifier (not shown), the data stored in the cell 10A is read out. In this read operation, the potential $V_{DD}$ may be applied to the wiring 62 by the controller 104, or the wiring 62 may be put into a floating state.

Further, as can be seen from the above explanation, the data read through the transistor 16 and the data read through the transistor 14A are of the H-level and the L-level, which are the opposite of each other.

As described above, the second embodiment can provide a semiconductor memory device including an SRAM (a transpose SRAM) that is capable of reducing the increase in power consumption, and performing data writing and reading in both row and column directions.

In the second embodiment, the switch 71 is disposed between the controller 102 and the wiring 53, and the switch 72 is disposed between the controller 104 and the wiring 64, to put the potential of the wiring 53 or the potential of the wiring 64 into a floating state at the time of writing. However, the switches 71 and 72 may not be provided, and the potential of the wiring 53 or the potential of the wiring 64 may be put into a floating state by the controller 102 or 104.

Figure 20:
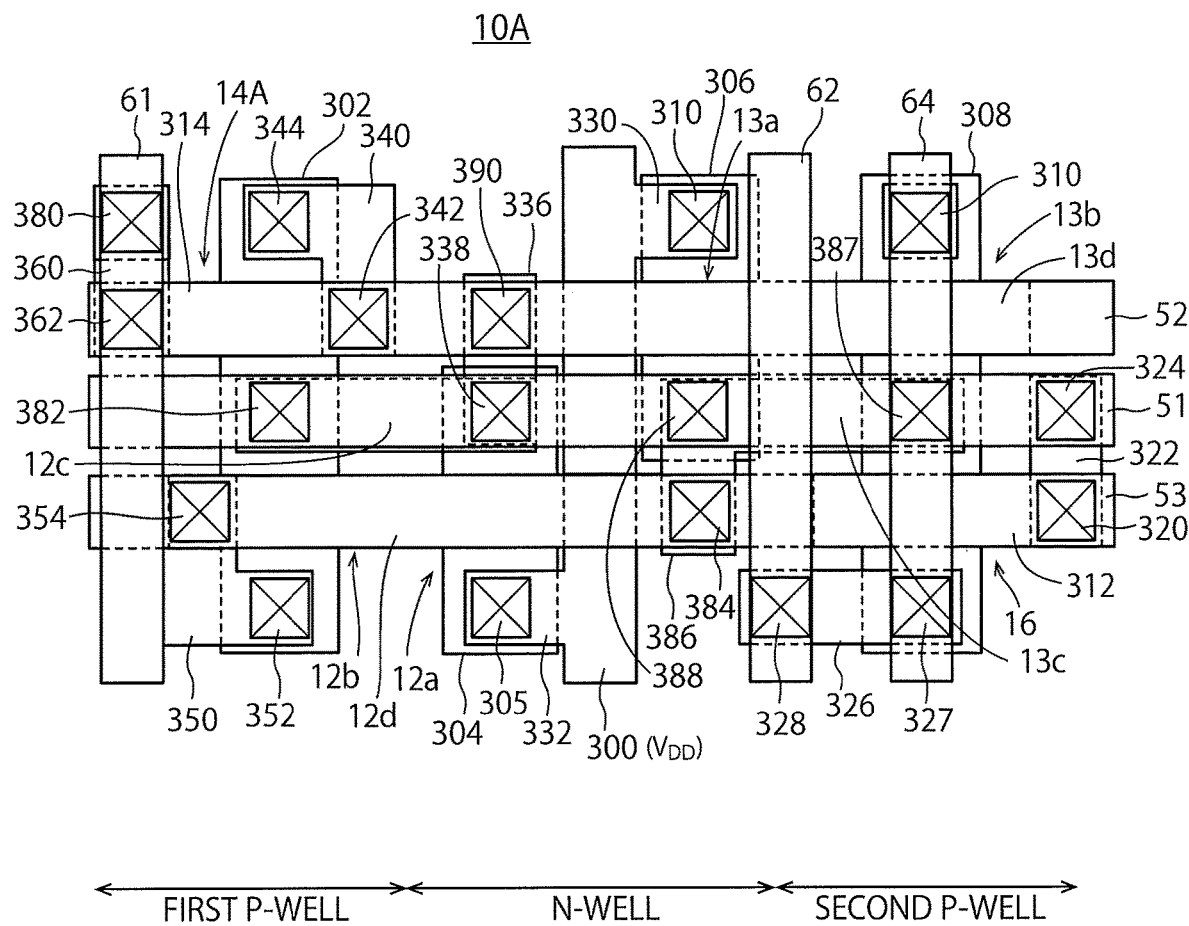
FIG. 20 is a diagram showing an example layout in the semiconductor memory device of the second embodiment.

FIG. 20 shows an example layout in a cell 10A of the semiconductor memory device of the second embodiment. A first P-well, a second P-well, and an N-well are formed in a semiconductor layer. The N-well is located between the first P-well and the second P-well.

The polysilicon-containing gate 314 of the transistor 14A is disposed so as to extend in the first P-well horizontally in FIG. 20. The polysilicon-containing wiring 12d that serves as the gates of the transistor 12b and the transistor 12a is disposed so as to extend in the first P-well horizontally in FIG. 20 and extend in the N-well horizontally in FIG. 20. An N-type impurity region 302 is formed in the first P-well on both sides of the gate of the transistor 14A, and the N-type impurity region 302 is also formed in the first P-well on both sides of the gate of the transistor 12b. The drain of the transistor 14A and the drain of the transistor 12b share the N-type impurity region 302 located between them. Further, P-type impurity regions 304 and 306 are formed in the N-well.

The polysilicon-containing wiring 13d that serves as the gates of the transistor 13a and the transistor 13b is disposed so as to extend in the N-well horizontally in FIG. 20 and extend in the second P-well horizontally in FIG. 20. The polysilicon-containing gate 312 of the transistor 16 is also disposed so as to extend in the second P-well horizontally in FIG. 20. The P-type impurity region 306 is formed in the N-well on both sides of the gate 13d of the transistor 13a. An N-type impurity region 308 is formed in the second P-well on both sides of the gate of the transistor 13b, and the N-type impurity region 308 is also formed in the second P-well on both sides of the gate 312 of the transistor 16. The drain of the transistor 16 and the drain of the transistor 13b share the N-type impurity region 308 located between them.

A wiring 300 connected to the power supply that supplies $V_{DD}$ is disposed on the N-well in the vertical direction as shown in FIG. 20. The wiring 300 is disposed on the region located between the P-type impurity region 304 and the P-type impurity region 306. A wiring 330 that is connected to the wiring 300 and is connected to the source of the transistor 13a via a contact 310 is also disposed in the horizontal direction of FIG. 20. A wiring 332 that is connected to the wiring 300 and is connected to the source of the transistor 12a via a contact 305 is disposed in the horizontal direction of FIG. 20. An L-shaped wiring 340 connected to the source of the transistor 14A via a contact 344 is disposed in the vertical direction and the horizontal direction of FIG. 20. An L-shaped wiring 350 connected to the source of the transistor 12b via a contact 352 is disposed in the vertical direction and the horizontal direction of FIG. 20. An L-shaped wiring 336 connected to the drains of the transistor 14A and the transistor 12b via a contact 382 is disposed in the vertical direction and the horizontal direction of FIG. 20. This wiring 336 is connected to the drain of the transistor 12a via a contact 338, and is connected to the wiring 13d via a contact 390. An L-shaped wiring 386 connected to the drains of the transistor 16 and the transistor 13b is disposed in the vertical direction and the horizontal direction of FIG. 20. This wiring 386 is connected to the drain of the transistor 13a via a contact 388, and is connected to the wiring 12d via a contact 384. A wiring 326 connected to the source of the transistor 16 via a contact 327 is disposed in the horizontal direction of FIG. 20. A wiring 322 connected to the gate of the transistor 16 via a contact 320 is disposed in the vertical direction of FIG. 20. A wiring 360 connected to the gate of the transistor 14A via a contact 362 is disposed in the vertical direction of FIG. 20. The wirings 300, 322, 326, 330, 332, 336, 340, 350, 360, and 386 are disposed in the first metal wiring layer.

The wiring 51 connected to the gate 312 of the transistor 16 via the wiring 322 and a contact 324 is disposed in the horizontal direction of FIG. 20. Further, the wiring 52 connected to the wiring 340 via a contact 342 is disposed above the gate of the transistor 13b, above the gate of the transistor 13a, and above the gate of the transistor 14A, in the horizontal direction of FIG. 20. The wiring 53 connected to the wiring 350 via a contact 354 is disposed above the gate of the transistor 16, above the gate of the transistor 12a, and above the gate of the transistor 12b, in the horizontal direction of FIG. 20. The wiring 51 is disposed in the region between the wiring 52 and the wiring 53. These wirings 51, 52, and 53 are disposed in the second metal wiring layer that is higher than the first metal wiring layer.

The wiring 61 connected to the gate 314 of the transistor 14A via the contact 362, the wiring 360, and a contact 380 is disposed in the vertical direction of FIG. 20. The wiring 62 connected to the source of the transistor 16 via the contact 327, the wiring 326, and a contact 328 is disposed in the vertical direction of FIG. 20. The wiring 64 connected to the source of transistor 13b via the contact 310 is disposed in the vertical direction of FIG. 20. The wiring 62 is disposed in the region between the wiring 61 and the wiring 64. These wirings 61, 62, and 64 are disposed in a third metal wiring layer that is higher than the second metal wiring layer.

The cell 10A having such a layout has the same connection structure as the cell 10A shown in FIG. 13. The layout shown in FIG. 20 is an example, and a layout having the same connection structure as the cell 10A shown in FIG. 13 can also be adopted.

Third Embodiment

Figure 21:
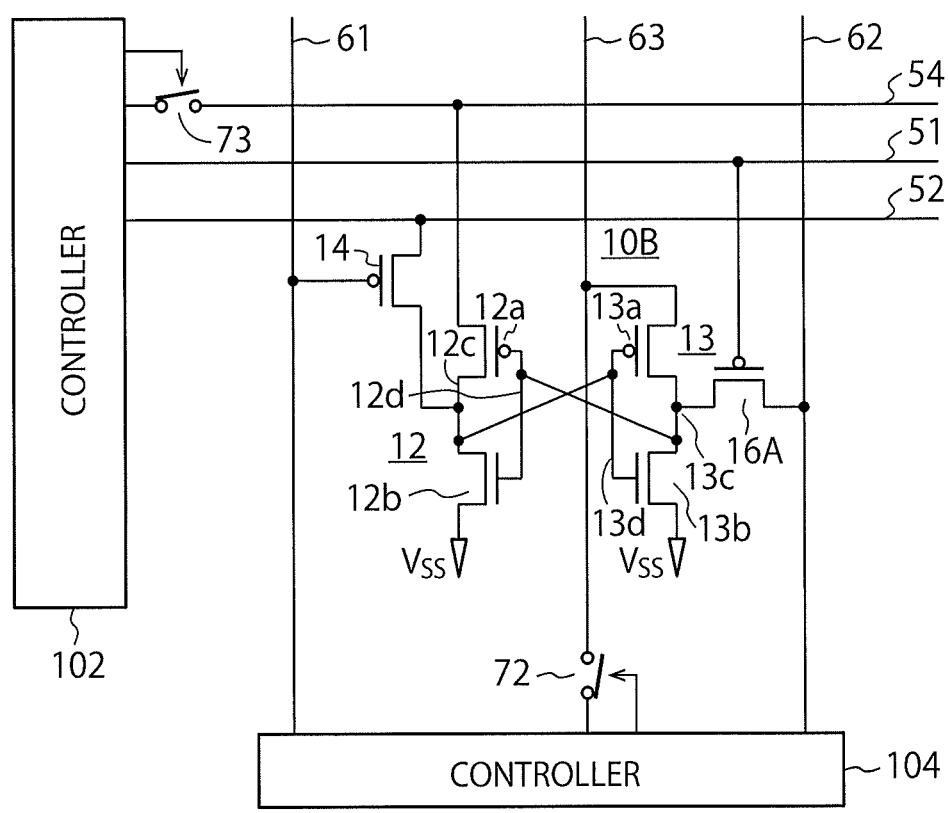
FIG. 21 is a circuit diagram showing the configuration of a semiconductor memory device according to a third embodiment.

As shown in FIG. 21, a semiconductor memory device according to a third embodiment includes at least one cell 10B, wirings 51, 52, and 54 that are arranged in the vertical direction and extend in the horizontal direction in the drawing, wirings 61, 62, and 63 that are arranged in the horizontal direction and extend in the vertical direction in the drawing, switches 72 and 73, and controllers 102 and 104.

A cell 10B includes two cross-connected inverters 12 and 13, a P-channel access transistor (hereinafter also referred to simply as a transistor) 14, and a P-channel access transistor (hereinafter also referred to simply as a transistor) 16A. That is, the cell 10B has the same configuration as the cell 10 of the first embodiment shown in FIG. 1, except that the N-channel transistor 16 is replaced with the P-channel transistor 16A. However, the source of the transistor 12a of the inverter 13 is connected to the wiring 54, and the source of the transistor 12b is connected to a ground power supply that supplies the potential $V_{SS}$. The transistor 13b of the inverter 13 has its drain connected to a ground power source that supplies the potential $V_{SS}$. The drain of the transistor 16A is connected to the wiring 62, and the source is connected to the wiring 13c of the inverter 13. The switch 72 is disposed between the wiring 63 and the controller 104. The switch 73 is disposed between the wiring 54 and the controller 102. Switch-on/off operations of the switch 72 are controlled by the controller 104, and switch-on/off operations of the switch 73 are controlled by the controller 102.

(Write Operations)

Write operations of the semiconductor memory device of the third embodiment having such a configuration will be described below, with reference to FIGS. 22 to 25.

(H-Level Data Writing)

Figure 22:
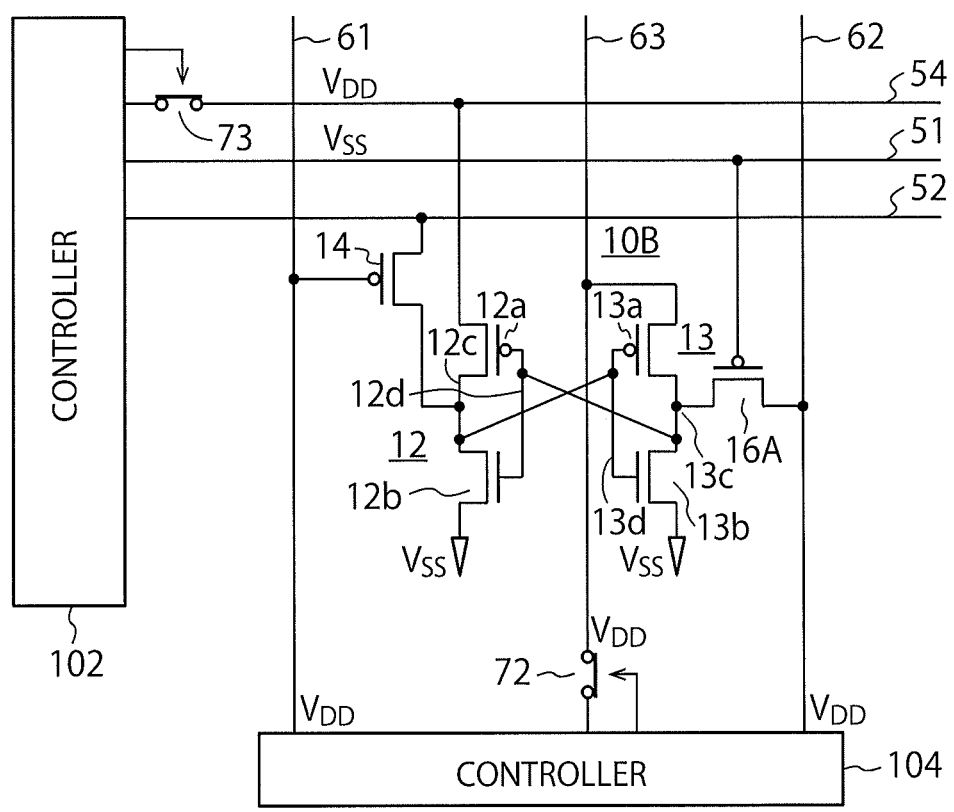
FIG. 22 is a diagram for explaining a first example of a write operation of the semiconductor memory device of the third embodiment.

First, in a case where the cell 10B holds L-level data, which is a case where the potential level of the wiring 13c of the inverter 13 is the L-level while the potential level of the wiring 12c of the inverter 12 is the H-level, H-level data may be written into the cell 10B with the transistor 16A. This case is now described. As shown in FIG. 22, the controller 102 puts the switch 73 into an on-state to apply the potential $V_{DD}$ to the wiring 54, and the controller 104 puts the switch 72 into an on-state to apply the potential $V_{DD}$ to the wiring 63. At this stage, the controller 104 applies the potential $V_{DD}$ to the wiring 61, to put the transistor 14 into an off-state. In this writing process, the wiring 52 may not be used and may be put into a floating state, or the potential $V_{SS}$ may be applied thereto.

The controller 104 sets the potential of the wiring 62 to $V_{DD}$, and the controller 102 lowers the potential of the wiring 51 from $V_{DD}$ to $V_{SS}$. Thus, the transistor 16A enters an on-state, the potential of the wiring 13c of the inverter 13 changes from the L-level to the H-level, and the H-level data can be written into the cell 10B.

Figure 23:
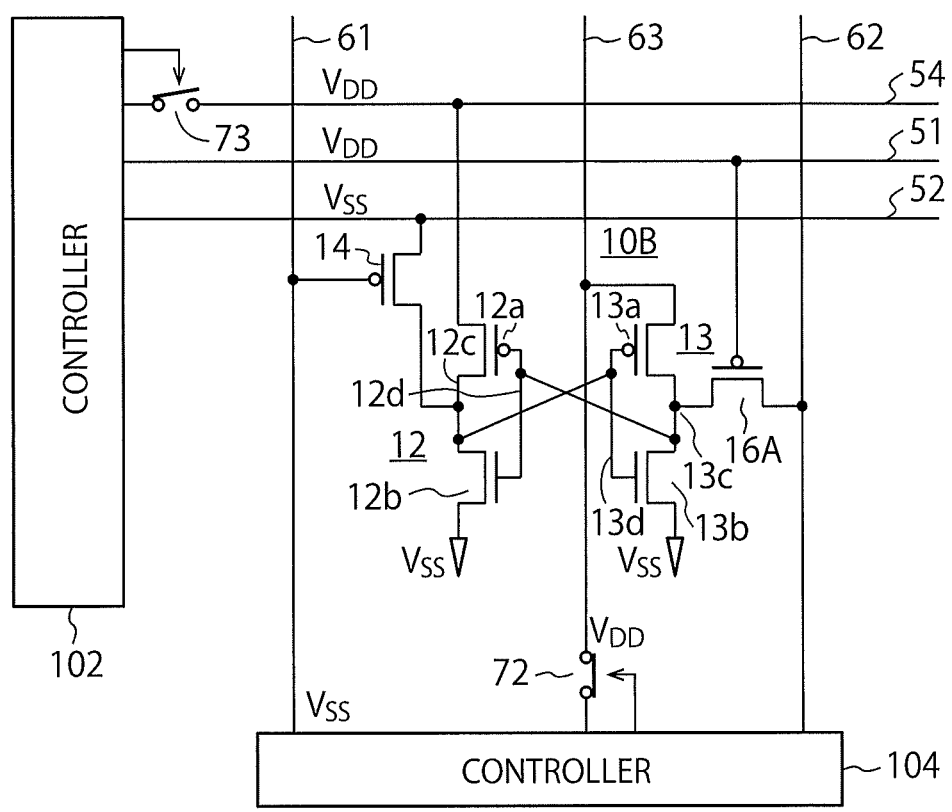
FIG. 23 is a diagram for explaining a second example of a write operation of the semiconductor memory device of the third embodiment.

Next, a case where H-level data is to be written into the cell 10B with the transistor 14 while the cell 10B holds L-level data is described. As shown in FIG. 23, the controller 102 puts the switch 73 into an off-state to put the wiring 54 into a floating state, and the controller 104 puts the switch 72 into an on-state to apply the potential $V_{DD}$ to the wiring 63. At this stage, the controller 102 applies the potential $V_{DD}$ to the wiring 51, to put the transistor 16A into an off-state. In this writing process, the wiring 62 may not be used and may be put into a floating state, or the potential $V_{SS}$ may be applied thereto.

The controller 102 sets the potential of the wiring 52 to $V_{SS}$, and the controller 104 lowers the potential of the wiring 61 from $V_{DD}$ to $V_{SS}$. As a result, the transistor 14 enters an on-state, and the potential of the wiring 12c of the inverter 12 changes from the H-level to the L-level. Thus, the transistor 13a of the inverter 13 enters an on-state, the potential of the wiring 13c of the inverter 13 switches to $V_{DD}$, and the H-level data can be written into the cell 10B.

(L-Level Data Writing)

Figure 24:
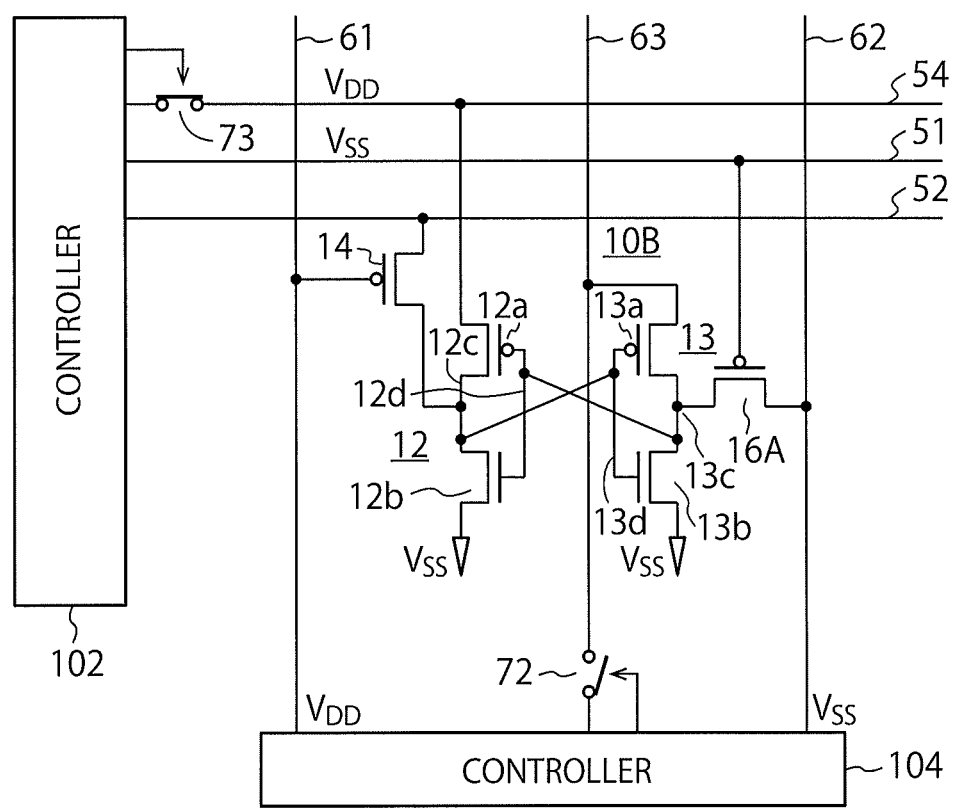
FIG. 24 is a diagram for explaining a third example of a write operation of the semiconductor memory device of the third embodiment.

Next, in a case where the cell 10B holds H-level data, which is a case where the potential level of the wiring 13c of the inverter 13 is the H-level while the potential level of the wiring 12c of the inverter 12 is the L-level, L-level data may be written into the cell 10B with the transistor 16A. This case is now described. As shown in FIG. 24, the controller 104 puts the switch 72 into an off-state, to put the wiring 63 into a floating state. At this stage, the controller 104 applies the potential $V_{DD}$ to the wiring 61, to put the transistor 14 into an off-state. In this writing process, the wiring 52 may not be used, and may be put into a floating state. The potential $V_{SS}$ may be applied to the wiring 52. Further, the controller 102 puts the switch 73 into an on-state, and applies the potential $V_{DD}$ to the wiring 54.

The controller 104 applies the potential $V_{SS}$ to the wiring 62, and the controller 102 lowers the potential of the wiring 51 from $V_{DD}$ to $V_{SS}$. As a result, the transistor 16A enters an on-state, and the potential of the wiring 13c of the inverter 13 drops from $V_{DD}$, as in the case described above with reference to FIG. 5. At this stage, the potential of the wiring 12c of the inverter 12 is at the L-level. Accordingly, the transistor 13a is in an on-state, and the transistor 13b is in an off-state. Therefore, the potential of the wiring 63 in a floating state drops from $V_{DD}$, as in the case described above with reference to FIG. 5. Further, as the potential of the wiring 13c of the inverter 13 drops, the transistor 12a of the inverter 12 enters an on-state while the transistor 12b enters an off-state, and the potential of the wiring 12c of the inverter 12 rises to a value close to the H-level. As a result, the transistor 13b of the inverter 13 enters an on-state, the potential of the wiring 13c of the inverter 13 switches to $V_{SS}$, and thus, the L-level data writing is completed.

Figure 25:
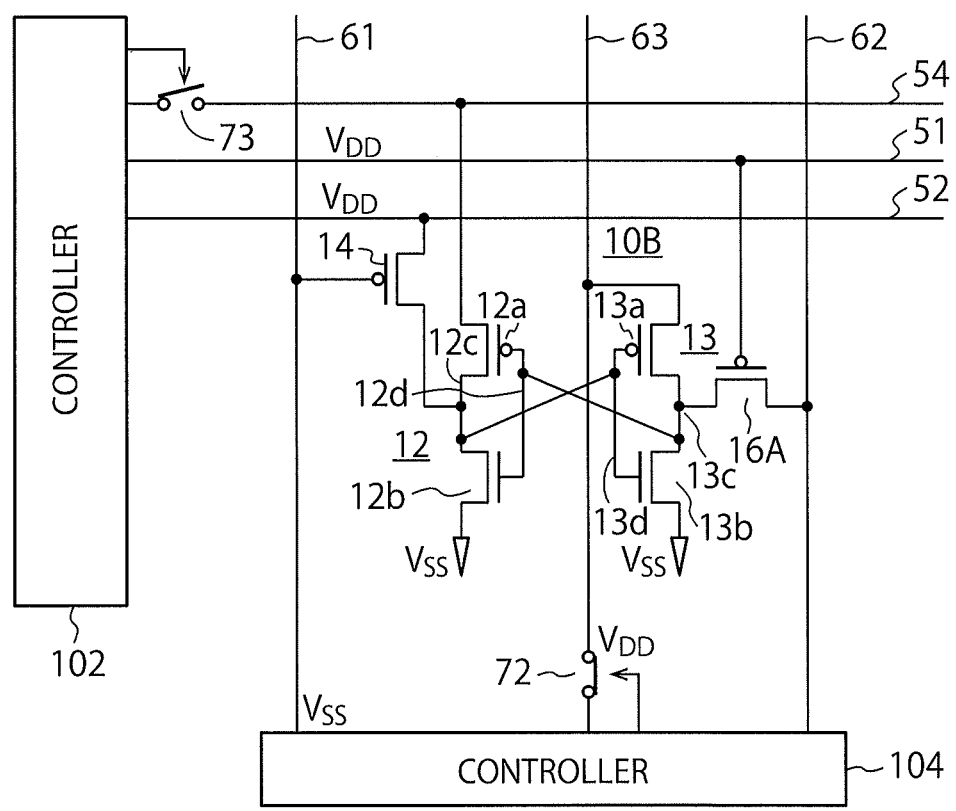
FIG. 25 is a diagram for explaining a fourth example of a write operation of the semiconductor memory device of the third embodiment.

Next, in a case where the cell 10B holds H-level data, which is a case where the potential level of the wiring 13c of the inverter 13 is the H-level while the potential level of the wiring 12c of the inverter 12 is the L-level, L-level data may be written into the cell 10B with the transistor 14. This case is now described. As shown in FIG. 25, the controller 102 puts the switch 73 into an off-state, to put the wiring 54 into a floating state. This is because the cell data to be written at the same time is unknown. At this stage, the controller 102 applies the potential $V_{DD}$ to the wiring 51, to put the transistor 16A into an off-state. Further, the controller 104 puts the switch 72 into an on-state, and applies the potential $V_{DD}$. In this writing process, the wiring 62 may not be used and may be put into a floating state, or the potential $V_{SS}$ may be applied to the wiring 62. Alternatively, the controller 104 may put the switch 72 into an off-state, to put the wiring 63 into a floating state.

The controller 102 applies the potential $V_{DD}$ to the wiring 52, and the controller 104 lowers the potential of the wiring 61 from $V_{DD}$ to $V_{SS}$. As a result, the transistor 14 enters an on-state, and the potential of the wiring 12c of the inverter 12 rises from $V_{SS}$. Since the potential of the wiring 12c of the inverter 12 rises, the transistor 13a of the inverter 13 enters an off-state, the transistor 13b enters an on-state, and the potential of the wiring 13c of the inverter 13 drops to the L-level. Thus, the transistor 12a of the inverter 12 enters an on-state, the potential of the wiring 12c of the inverter 12 switches to $V_{DD}$, and the L-level data writing is completed.

(Read Operations)

Figure 26:
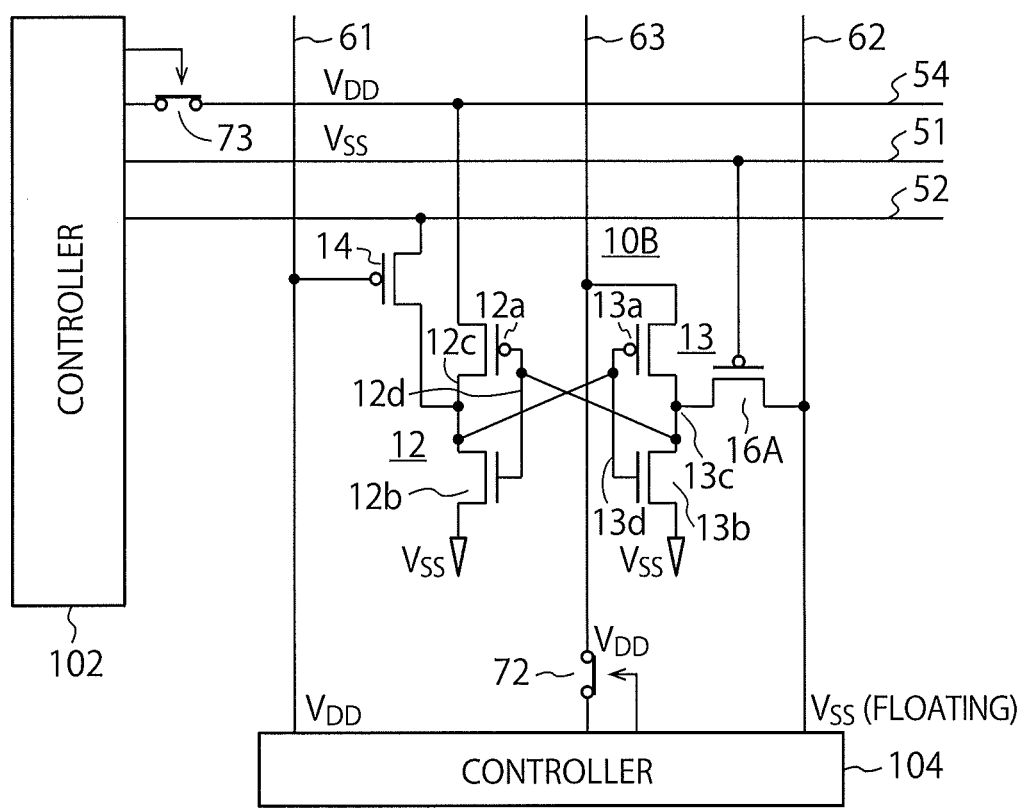
FIG. 26 is a diagram for explaining a first example of a read operation of the semiconductor memory device of the third embodiment.
Figure 27:
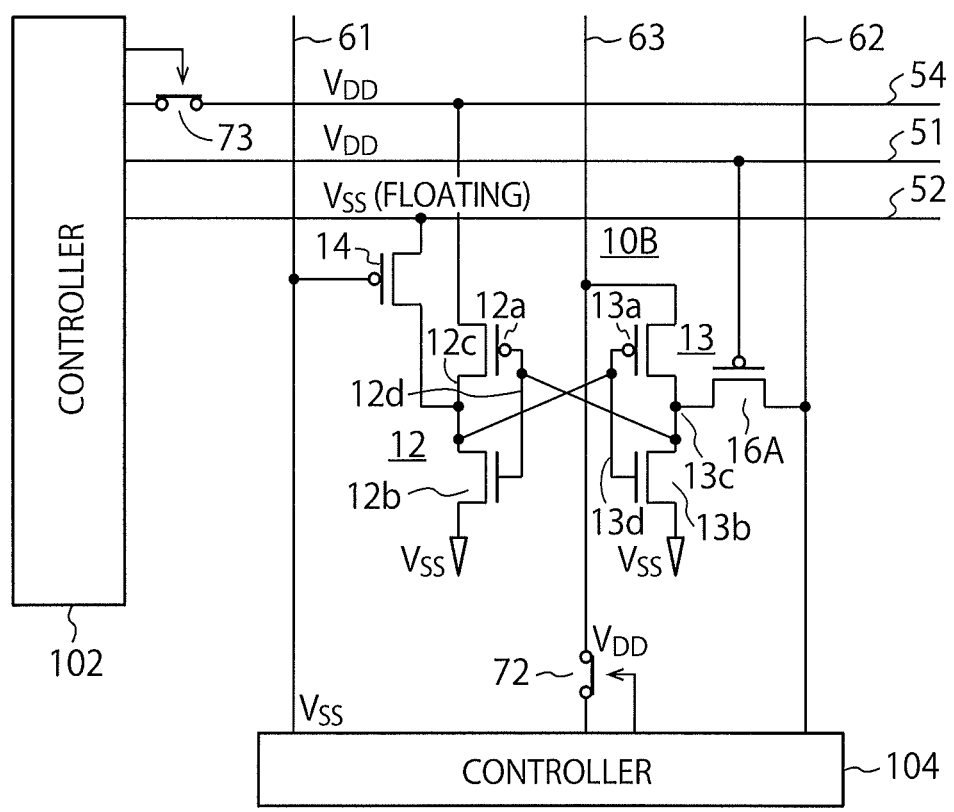
FIG. 27 is a diagram for explaining a second example of a read operation of the semiconductor memory device of the third embodiment.

Next, cases where data is read from the cell 10B will be described with reference to FIGS. 26 and 27.

First, in a case where data is to be read from the cell 10B via the transistor 16A, the controller 102 puts the switch 73 into an on-state and fixes the potential of the wiring 53 to $V_{DD}$, and the controller 104 puts the switch 72 into an on-state and fixes the voltage of the wiring 63 to $V_{DD}$. The controller 104 also applies the potential $V_{DD}$ to the wiring 61 to put the transistor 14 into an off-state, and discharges the potential of the wiring 62 to $V_{SS}$ (FIG. 26). In this state, the controller 102 lowers the potential of the wiring 51 to $V_{SS}$. The transistor 16A then enters an on-state, and the potential of the wiring 62 discharged to $V_{SS}$ becomes a signal corresponding to the potential of the wiring 13c of the inverter 13. That is, in a case where the data held in the wiring 13c is of the L-level, the potential of the wiring 62 does not change and remains $V_{SS}$. In a case where the data held in the wiring 13c is of the H-level, the potential of the wiring 62 rises. As the potential of the wiring 62 is amplified with a sense amplifier (not shown), the data stored in the cell 10B is read out. In this read operation, the potential $V_{SS}$ may be applied to the wiring 52 by the controller 102, or the wiring 52 may be put into a floating state.

Next, in a case where data is to be read from the cell 10B via the transistor 14, the controller 102 puts the switch 73 into an on-state and fixes the voltage of the wiring 54 to $V_{DD}$, and the controller 104 puts the switch 72 into an on-state and applies the potential $V_{DD}$ to the wiring 63. The controller 102 also applies the potential $V_{DD}$ to the wiring 51 to put the transistor 16A into an off-state, and discharges the potential of the wiring 52 to $V_{SS}$ (FIG. 27). In this state, the potential of the wiring 61 is lowered to $V_{SS}$. The transistor 14 then enters an on-state, and the potential of the wiring 52 discharged to $V_{SS}$ becomes a signal corresponding to the potential of the wiring 12c of the inverter 12. That is, in a case where the data held in the wiring 12c is of the H-level, the potential of the wiring 52 rises from $V_{SS}$. In a case where the data held in the wiring 12c is of the L-level, the potential of the wiring 52 does not change but remains $V_{SS}$. As the potential of the wiring 52 is amplified with a sense amplifier (not shown), the data stored in the cell 10B is read out. In this read operation, the potential $V_{SS}$ may be applied to the wiring 62 by the controller 104, or the wiring 62 may be put into a floating state.

Further, as can be seen from the above explanation, the data read through the transistor 16A and the data read through the transistor 14 are of the H-level and the L-level, which are the opposite of each other.

As described above, the third embodiment can provide a semiconductor memory device including an SRAM (a transpose SRAM) that is capable of reducing the increase in power consumption, and performing data writing and reading in both row and column directions.

In the third embodiment, the switch 73 is disposed between the controller 102 and the wiring 54, and the switch 72 is disposed between the controller 104 and the wiring 63, to put the potential of the wiring 54 or the potential of the wiring 63 into a floating state at the time of writing. However, the switches 72 and 73 may not be provided, and the potential of the wiring 54 or the potential of the wiring 63 may be put into a floating state by the controller 102 or 104.

Figure 28:
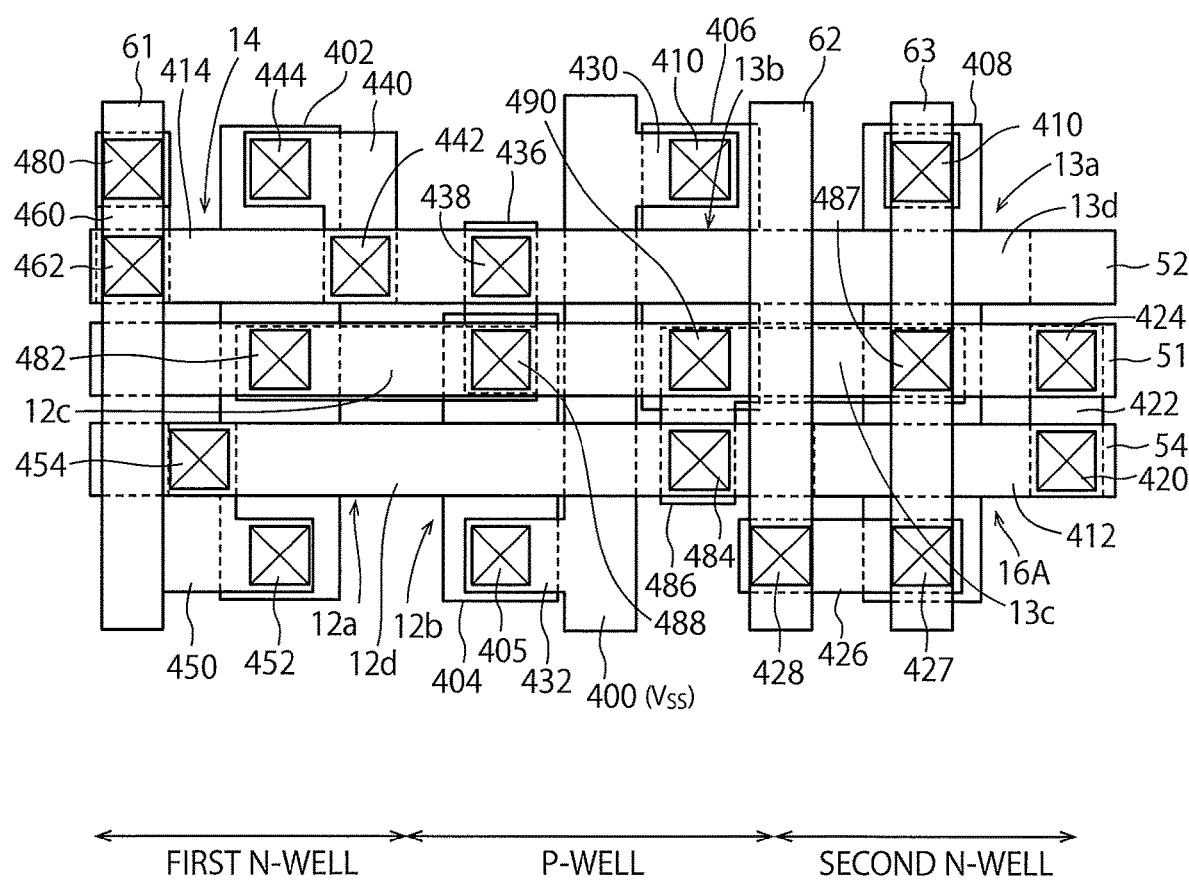
FIG. 28 is a diagram showing an example layout in the semiconductor memory device of the third embodiment.

FIG. 28 shows an example layout in a cell 10B of the semiconductor memory device of the third embodiment. A first N-well, a second N-well, and a P-well are formed in a semiconductor layer. The P-well is disposed between the first N-well and the second N-well.

The polysilicon-containing gate 414 of the transistor 14 is disposed so as to extend in the first N-well horizontally in FIG. 28. The polysilicon-containing wiring 12d that serves as the gates of the transistor 12b and the transistor 12a is disposed so as to extend in the first N-well horizontally in FIG. 28 and extend in the P-well horizontally in FIG. 28. A P-type impurity region 402 is formed in the first N-well on both sides of the gate 414 of the transistor 14, and the P-type impurity region 402 is also formed in the first N-well on both sides of the gate 12d of the transistor 12a. The drain of the transistor 14 and the drain of the transistor 12a share the P-type impurity region 402 located between them. Further, N-type impurity regions 404 and 406 are formed in the P-well.

The polysilicon-containing wiring 13d that serves as the gates of the transistor 13a and the transistor 13b is disposed so as to extend in the P-well horizontally in FIG. 28 and extend in the second N-well horizontally in FIG. 28. Also, the polysilicon-containing gate 412 of the transistor 16A is disposed so as to extend in the second N-well horizontally in FIG. 28. A P-type impurity region 408 is formed in the second N-well on both sides of the gate 412 of the transistor 16A, and the P-type impurity region 408 is also formed in the second N-well on both sides of the gate 13d of the transistor 13a. The drain of the transistor 16A and the drain of the transistor 13a share the P-type impurity region 408 located between them.

A wiring 400 connected to the power supply that supplies $V_{SS}$ is disposed on the P-well in the vertical direction as shown in FIG. 28. The wiring 400 is disposed on the region located between the N-type impurity region 404 and the N-type impurity region 406. A wiring 430 that is connected to the wiring 400 and is connected to the source of the transistor 13b via a contact 410 is also disposed in the horizontal direction of FIG. 28. A wiring 432 that is connected to the wiring 400 and is connected to the source of the transistor 12b via a contact 405 is disposed in the horizontal direction of FIG. 28. An L-shaped wiring 440 connected to the source of the transistor 14 via a contact 444 is disposed in the vertical direction and the horizontal direction of FIG. 28. An L-shaped wiring 450 connected to the source of the transistor 12a via a contact 452 is disposed in the vertical direction and the horizontal direction of FIG. 28. An L-shaped wiring 436 connected to the drains of the transistor 14 and the transistor 12a via a contact 482 is disposed in the vertical direction and the horizontal direction of FIG. 28. This wiring 436 is connected to the drain of the transistor 12b via a contact 488, and is connected to the gate wiring 13d of the transistors 13a and 13b via a contact 438. An L-shaped wiring 486 connected to the drains of the transistor 16A and the transistor 13a is disposed in the vertical direction and the horizontal direction of FIG. 28. This wiring 486 is connected to the drain of the transistor 13b via a contact 490, and is connected to the gate wiring 12d of the transistors 12a and 12b via the contact 438. A wiring 426 connected to the source of the transistor 16A via a contact 427 is disposed in the horizontal direction of FIG. 28. A wiring 422 connected to the gate of the transistor 16A via a contact 420 is disposed in the vertical direction of FIG. 28. A wiring 460 connected to the gate of the transistor 14 via a contact 462 is disposed in the vertical direction of FIG. 28. The wirings 400, 422, 426, 430, 432, 436, 440, 450, 460, and 486 are disposed in the first metal wiring layer.

The wiring 51 connected to the gate 412 of the transistor 16A via the wiring 422 and a contact 424 is disposed in the horizontal direction of FIG. 28. Further, the wiring 52 connected to the wiring 440 via a contact 442 is disposed above the gate of the transistor 13a, above the gate of the transistor 13b, and above the gate of the transistor 14, in the horizontal direction of FIG. 28. The wiring 54 connected to the wiring 450 via a contact 454 is disposed above the gate of the transistor 16A, above the gate of the transistor 12b, and above the gate of the transistor 12a, in the horizontal direction of FIG. 28. The wiring 51 is disposed in the region between the wiring 52 and the wiring 54. These wirings 51, 52, and 54 are disposed in the second metal wiring layer that is higher than the first metal wiring layer.

The wiring 61 connected to the gate 414 of the transistor 14 via the contact 462, the wiring 460, and a contact 480 is disposed in the vertical direction of FIG. 28. The wiring 62 connected to the source of the transistor 16A via the contact 427, the wiring 426, and a contact 428 is disposed in the vertical direction of FIG. 28. The wiring 63 connected to the source of transistor 13a via the contact 410 is disposed in the vertical direction of FIG. 28. The wiring 62 is disposed in the region between the wiring 61 and the wiring 63. These wirings 61, 62, and 63 are disposed in the third metal wiring layer that is higher than the second metal wiring layer.

The cell 10B having such a layout has the same connection structure as the cell 10B shown in FIG. 21. The layout shown in FIG. 28 is an example, and a layout having the same connection structure as the cell 10B shown in FIG. 21 can also be adopted.

As described above, each embodiment can provide a semiconductor memory device including an SRAM (a transpose SRAM) that is capable of reducing the increase in power consumption, and performing data writing and reading in both row and column directions.

Although embodiments of the present invention have been described, these embodiments are merely examples, and are not intended to limit the scope of the invention. These embodiments can be carried out in other various modes, and omissions, replacements, and changes can be made to them without departing from the scope of the invention. These embodiments and modifications thereof are included in the scope and the subject matter of the invention, and are also included in the claimed inventions and the equivalents thereof.

The invention claimed is:

1. A semiconductor memory device comprising:
  a first inverter including a first P-channel transistor and a first N-channel transistor that are connected in series;
  a second inverter including a second P-channel transistor and a second N-channel transistor that are connected in series, the second inverter being cross-connected to the first inverter;
  a third P-channel transistor that has one of a source and a drain connected to a drain of the first P-channel transistor and a drain of the first N-channel transistor;
  a third N-channel transistor that has one of a source and a drain connected to a drain of the second P-channel transistor and a drain of the second N-channel transistor;
  a first wiring that is disposed in a first direction and is connected to the other one of the source and the drain of the third P-channel transistor;
  a second wiring that is disposed in the first direction and is connected to a gate of the third N-channel transistor;
  a third wiring that is disposed in a second direction intersecting the first direction and is connected to a gate of the third P-channel transistor;
  a fourth wiring that is disposed in the second direction and is connected to the other one of the source and the drain of the third N-channel transistor;
  a fifth wiring that is disposed in the first direction and is connected to a source of the first N-channel transistor and a source of the second N-channel transistor;
  a sixth wiring that is disposed in the second direction and is connected to a source of the first P-channel transistor and a source of the second P-channel transistor; and
  a controller that drives the first to sixth wirings,
  wherein, when writing second-level data that is at a higher potential level than first-level data into the drain of the second P-channel transistor and the drain of the second N-channel transistor, the controller puts one of the fifth wiring and the sixth wiring into a floating state.

2. The semiconductor memory device according to claim 1, wherein, when writing the second-level data with the third N-channel transistor and the fourth wiring, the controller puts the fifth wiring into a floating state.

3. The semiconductor memory device according to claim 2, wherein, when writing the second-level data, the controller applies a second potential level to the second wiring, the third wiring, the fourth wiring, and the sixth wiring, the second potential level being higher than a first potential level applied to the fifth wiring.

4. The semiconductor memory device according to claim 1, wherein, when writing the second-level data with the third P-channel transistor and the first wiring, the controller puts the sixth wiring into a floating state.

5. The semiconductor memory device according to claim 4, wherein, when writing the second-level data, the controller applies a first potential level to the first wiring, the second wiring, the third wiring, and the fifth wiring, the first potential level being lower than a second potential level applied to the sixth wiring.

6. The semiconductor memory device according to claim 1, further comprising:
  a first switch that is disposed between the fifth wiring and the controller, and is controlled to be in an on-state or an off-state by the controller; and
  a second switch that is disposed between the sixth wiring and the controller, and is controlled to be in an on-state or an off-state by the controller.

7. A semiconductor memory device comprising:
  a first inverter including a first P-channel transistor and a first N-channel transistor that are connected in series;
  a second inverter including a second P-channel transistor and a second N-channel transistor that are connected in series, the second inverter being cross-connected to the first inverter;
  a third N-channel transistor that has one of a source and a drain connected to a drain of the first P-channel transistor and a drain of the first N-channel transistor;
  a fourth N-channel transistor that has one of a source and a drain connected to a drain of the second P-channel transistor and a drain of the second N-channel transistor;
  a first wiring that is disposed in a first direction and is connected to the other one of the source and the drain of the third N-channel transistor;
  a second wiring that is disposed in the first direction and is connected to a gate of the fourth N-channel transistor;
  a third wiring that is disposed in a second direction intersecting the first direction and is connected to a gate of the third N-channel transistor;
  a fourth wiring that is disposed in the second direction and is connected to the other one of the source and the drain of the fourth N-channel transistor;
  a fifth wiring that is disposed in the first direction and is connected to a source of the first N-channel transistor;
  a sixth wiring that is disposed in the second direction and is connected to a source of the second N-channel transistor; and
  a controller that drives the first to sixth wirings,
  wherein, when writing second-level data that is at a higher potential level than first-level data into the drain of the second P-channel transistor and the drain of the second N-channel transistor, the controller puts the sixth wiring into a floating state.

8. The semiconductor memory device according to claim 7, wherein the controller writes the second-level data, using the fourth N-channel transistor and the fourth wiring.

9. The semiconductor memory device according to claim 8, wherein,
  when writing the second-level data, the controller applies a second potential level higher than a first potential level to the second wiring and the fourth wiring, and applies the first potential level to the third wiring, and before an end of the write operation, the controller applies the first potential level to the sixth wiring.

10. The semiconductor memory device according to claim 7, wherein, when writing the first-level data into the drain of the second P-channel transistor and the drain of the second N-channel transistor, the controller puts the fifth wiring into a floating state.

11. The semiconductor memory device according to claim 10, wherein the controller writes the second-level data, using the third N-channel transistor and the first wiring.

12. The semiconductor memory device according to claim 11, wherein,
when writing the first-level data, the controller applies a second potential level higher than a first potential level to the first wiring and the third wiring, and applies the first potential level to the second wiring and the sixth wiring, and
before an end of the write operation, the controller applies the first potential level to the fifth wiring.

13. The semiconductor memory device according to claim 7, further comprising:
a first switch that is disposed between the fifth wiring and the controller, and is controlled to be in an on-state or an off-state by the controller; and
a second switch that is disposed between the sixth wiring and the controller, and is controlled to be in an on-state or an off-state by the controller.

14. A semiconductor memory device comprising:
a first inverter including a first P-channel transistor and a first N-channel transistor that are connected in series;
a second inverter including a second P-channel transistor and a second N-channel transistor that are connected in series, the second inverter being cross-connected to the first inverter;
a third P-channel transistor that has one of a source and a drain connected to a drain of the first P-channel transistor and a drain of the first N-channel transistor;
a fourth P-channel transistor that has one of a source and a drain connected to a drain of the second P-channel transistor and a drain of the second N-channel transistor;
a first wiring that is disposed in a first direction and is connected to the other one of the source and the drain of the third P-channel transistor;
a second wiring that is disposed in the first direction and is connected to a gate of the fourth P-channel transistor;
a third wiring that is disposed in a second direction intersecting the first direction and is connected to a gate of the third P-channel transistor;
a fourth wiring that is disposed in the second direction and is connected to the other one of the source and the drain of the fourth P-channel transistor;
a fifth wiring that is disposed in the first direction and is connected to a source of the first P-channel transistor;
a sixth wiring that is disposed in the second direction and is connected to a source of the second P-channel transistor; and
a controller that drives the first to sixth wirings,
wherein, when writing second-level data that is at a lower potential level than first-level data into the drain of the second P-channel transistor and the drain of the second N-channel transistor, the controller puts one of the fifth wiring and the sixth wiring into a floating state.

15. The semiconductor memory device according to claim 14, wherein, when writing the second-level data with the fourth P-channel transistor and the fourth wiring, the controller puts the sixth wiring into a floating state.

16. The semiconductor memory device according to claim 15, wherein, when writing the second-level data, the controller applies a second potential level lower than a first potential level to the second wiring and the fourth wiring, and applies the first potential level to the third wiring and the fifth wiring.

17. The semiconductor memory device according to claim 14, wherein, when writing the second-level data into the drain of the second P-channel transistor and the drain of the second N-channel transistor, the controller puts the fifth wiring into a floating state.

18. The semiconductor memory device according to claim 17, wherein the controller writes the second-level data, using the third P-channel transistor and the first wiring.

19. The semiconductor memory device according to claim 18, wherein, when writing the second-level data, the controller applies a first potential level to the first wiring and the second wiring, and applies a second potential level lower than the first potential level to the third wiring.

20. The semiconductor memory device according to claim 14, further comprising:
a first switch that is disposed between the fifth wiring and the controller, and is controlled to be in an on-state or an off-state by the controller; and
a second switch that is disposed between the sixth wiring and the controller, and is controlled to be in an on-state or an off-state by the controller.

* * * * *